United States Patent [19]

Ovshinsky et al.

[11] Patent Number: 5,426,092
[45] Date of Patent: * Jun. 20, 1995

[54] CONTINUOUS OR SEMI-CONTINUOUS LASER ABLATION METHOD FOR DEPOSITING FLUORINATED SUPERCONDUCTING THIN FILM HAVING BASAL PLANE ALIGNMENT OF THE UNIT CELLS DEPOSITED ON NON-LATTICE-MATCHED SUBSTRATES

[75] Inventors: Stanford R. Ovshinsky, Bloomfield Hills; Rosa Young, Troy, both of Mich.

[73] Assignee: Energy Conversion Devices, Inc., Troy, Mich.

[ * ] Notice: The portion of the term of this patent subsequent to Jun. 23, 2009 has been disclaimed.

[21] Appl. No.: 905,159

[22] Filed: Jun. 25, 1992

Related U.S. Application Data

[63] Continuation of Ser. No. 711,840, Jun. 7, 1991, abandoned, which is a continuation-in-part of Ser. No. 570,190, Aug. 20, 1990, Pat. No. 5,124,310.

[51] Int. Cl.$^6$ .................. H01B 12/00; B05D 5/12
[52] U.S. Cl. .................. 505/461; 505/731; 505/780; 505/123; 505/729; 427/596; 427/120; 427/126.3; 427/126.5; 427/377
[58] Field of Search .................. 505/1, 731, 780; 427/596, 120, 126.3, 126.5, 377

[56] References Cited

U.S. PATENT DOCUMENTS 5,124,310 6/1992 Ovsninsky et al. .................. 505/1

OTHER PUBLICATIONS

De Santolo et al Applied Physics Letters 52(23) 6 Jun. 1988, pp. 1995–1997.

*Primary Examiner*—Shrive Beck
*Assistant Examiner*—Benjamin L. Utech

[57] ABSTRACT

A thin film, high $T_c$ fluorinated, superconducting having a lattice structure differing from the lattice structure of the material substrate, such as sapphire or stainless steel, upon which it is grown. The superconducting material is characterized by basal plane alignment of the unit cells thereof even though the substrate does not possess a perovskite lattice structure. A laser ablation technique is used to evaporate material from a fluorinated pellet of target material to deposit the fluorinated superconducting material on the substrate. The instant invention provides for a low pressure and relatively low temperature method of depositing a superconducting film which is characterized by (1) a minimal number of high angle grain boundaries typically associated with polycrystalline films, and (2) aligned a, b, and c axes of the unit cells thereof so as to provide for enhanced current carrying capacities. Large area, irregularly shaped and rolls of inexpensive substrate material can be uniformly covered by the method described herein.

24 Claims, 14 Drawing Sheets

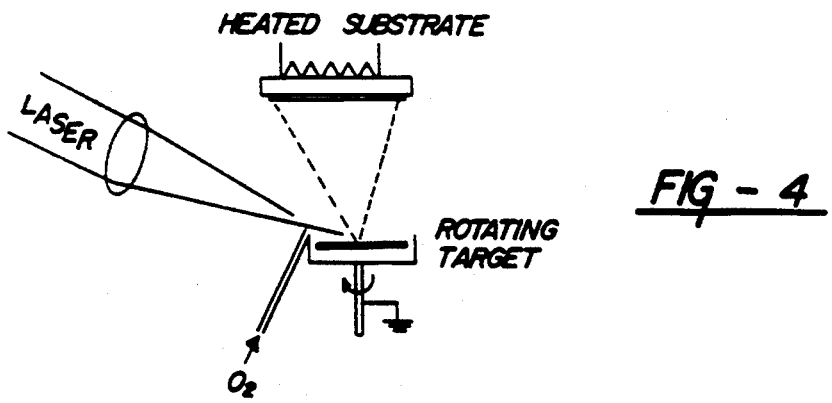
FIG - 4
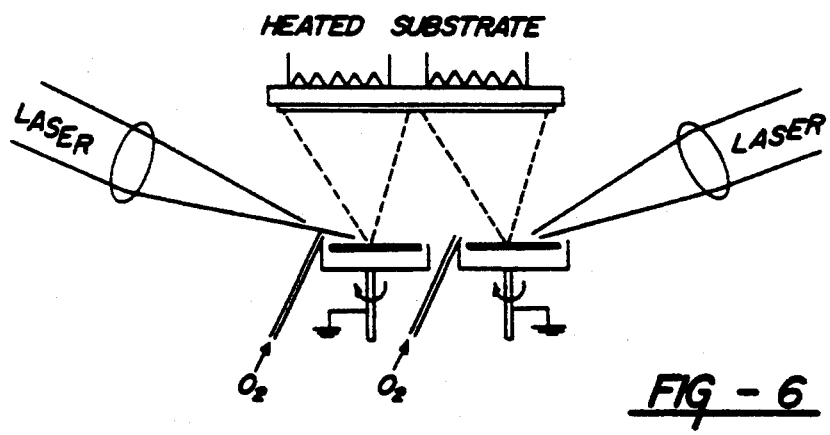
FIG - 6
FIG - 5
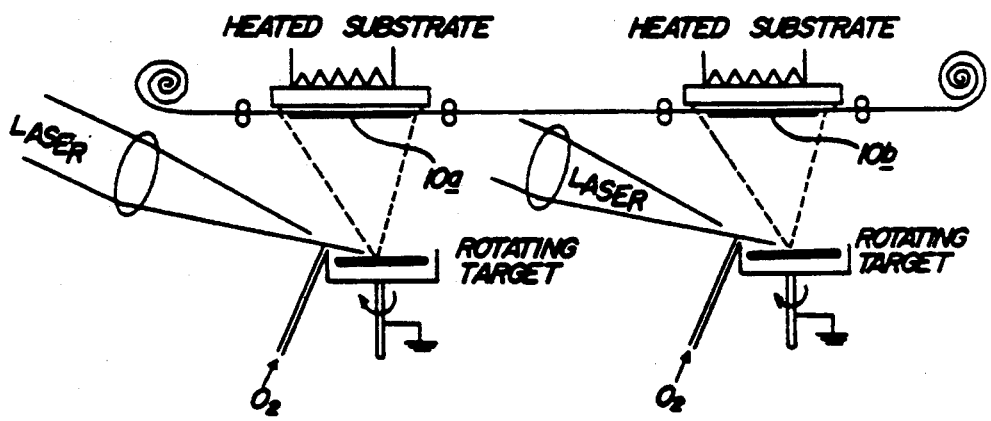

FIG-8  $Y_1Ba_2Cu_3O_7$  T= 77 K

○ ST 320 nm  $SrTiO_3$
△ KT 175  $KTaO_3$
◇ LA 95  $LaAlO_3$
□ LA 77  $LaAlO_3$
▽ LA 20  $LaAl_2O_3$
■ SAPPHIRE 200

FIG-9 Bright field TEM micrograph of an as-deposited epitaxial YBaCuO(F) film on sapphire.

Bright field TEM micrograph of an as-deposited epitaxial YBaCuO(F) film on sapphire. Top surface of the film was thinned by ion milling process.

SEM MICROGRAPHS SHOWING THE
SURFACE MORPHOLOGY OF THE LASER
DEPOSITED HIGH Tc SUPERCONDUCTING
FILMS ON 1.8 MICRON (111) Ag ON MICA a.) YBCO TARGET, 680 C, 50 mT
b.) YBCO TARGET, 680 C, 200 mT

SEM MICROGRAPHS SHOWING THE
SURFACE MORPHOLOGY OF BiSrCaCuO
FILM ON SAPPHIRE.

CONTINUOUS OR SEMI-CONTINUOUS LASER ABLATION METHOD FOR DEPOSITING FLUORINATED SUPERCONDUCTING THIN FILM HAVING BASAL PLANE ALIGNMENT OF THE UNIT CELLS DEPOSITED ON NON-LATTICE-MATCHED SUBSTRATES

PRIOR APPLICATION

This application is a continuation of application Ser. No. 07/711,840 filed on Jun. 7, 1991 now abandoned which is a continuation-in-part of U.S. Ser. No. 570,190 filed Aug. 20, 19980, now U.S. Pat. No. 5,124,310.

FIELD OF THE INVENTION

The instant invention relates generally to superconducting materials, and more particularly to thin films of fluorinated, high $T_c$, perovskite-type superconducting materials deposited on non-perovskite substrates and which materials are characterized by a-b axis (basal plane) as well as c-axis alignment of the unit cells thereof. Utilizing the technique described herein, it for the first time becomes possible to continuously deposit device quality "epitaxial-like," large area superconducting films. It also becomes possible to fabricate elongated, relatively flexible superconducting films on inexpensive substrates specifically adapted for high field and other electronic device applications.

BACKGROUND OF THE INVENTION

The attainment of high-temperature superconductivity with a new class of superconducting materials was of immense scientific and technological importance. Many members of this new class of superconducting materials belong to the family of ceramics called "perovskites". Typically, perovskites are described by the general formula $ABX_3$ and consist of cubes made up of three distinct elements which are present in a 1:1:3 ratio. The perovskite structure is similar to the naturally occurring calcium titanate structure, $CATiO_3$, characterized by at least one cation much larger than the other cation or cations. Also included in this family of ceramics are the tungsten bronzes, $NaWO_3$, strontium titanate, barium titanate, $YAlO_3$, $LaGaO_3$, $NaNbO_3$, $KNbO_3$, $KMgF_3$, $KMiF_3$ and $KZnF_3$, among others. In the perovskite structure the larger ions ($La^{+3} = 1.15$ angstroms, $Ba^{+2} = 1.35$ angstroms, and $O^{+2} = 1.40$ angstroms) form a cubic close packed structure, with the smaller ions ($Cu^{+2} = 0.96$ angstroms, $Y^{+3} = 0.09$ angstroms) occupying octahedral interstices in an ordered pattern. Together they form a cubic close packed (face centered cubic) array.

In late 1986, the superconducting properties of certain ceramic defect oxide type materials, which materials are variations of the typical perovskite class of inorganic structures, were observed by Bednorz and Mueller. The Bednorz and Mueller work was based upon materials developed by Michel and Raveau. The materials which Bednorz and Mueller observed contained lanthanum, barium copper, and oxygen, and were reported to be superconducting at a temperature of about 30 degrees Kelvin. Continued work in the field resulted in the increase of the critical temperature, $T_c$ (the temperature at which electrons or holes are able to move through a material without encountering any resistance to that motion), by the substitution of yttrium for lanthanum. Upon analysis, the superconducting composition was found to be a perovskite ceramic defect oxide of the $Y_1Ba_2Cu_3O_7$ type, an orthorombically distorted perovskite. Further work with this phase effectively raised the critical temperature to a few degrees above 90 degrees Kelvin (a temperature above the atmospheric boiling point of liquid nitrogen).

The ceramic defect oxide perovskite phase, having the general composition

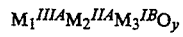

$$M_1^{IIIA}M_2^{IIA}M_3^{IB}O_y$$

was identified utilizing electron microprobe analysis, x-ray diffraction, scanning electron microscopy, and transmission electron microscopy. This ceramic defect oxide perovskite, phase was characterized as having a recurring crystallographic unit cell structure including substantially parallel a and b planes spacedly disposed along and substantially parallel to the c-axis thereof.

More specifically, the central plane is a plane of the $M^{IIIA}O$ type, as a Y—O or La—O plane, with the Group IIIA Metal being surrounded at its four coplanar corners by oxygen sites, which may be occupied or vacant. Immediately above and below this $M^{IIIA}$-O plane are equivalent $M^{IB}$-O planes of the second type, i.e., Cu—O planes, which the Group IB metal ions being at the four corners of the plane, and occupied oxygen sites being along each edge of the planes. These square planar $M^{IB}$ atoms (or ions), each surrounded by four oxygen atoms (or ions) have been reported to be critical to superconductivity in the defect oxide perovskites. A pair of $M^{IIIA}$-O planes are disposed between $M^{IB}$-O planes, as shown in FIG. 1, with the first type $M^{IB}$-O planes disposed on opposite sides thereof relative to the second type $M^{IB}$-O planes. As mentioned above, the vacancies (unoccupied sites) reported to reside in the first type $M^{IB}$-O planes are the result of the requirement of electrical neutrality. While the vacancies are generally reported to be in the $M^{IB}$-O planes, they may also be in the other planes, as in the $M^{IIIA}$-O planes. In fact, oxygen is totally absent in the (yttrium) planes.

Other perovskite phase materials have a recurring crystallographic unit cell structure including substantially parallel a and b planes spacedly disposed along and substantially parallel to the c-axis thereof. These other perovskite phase materials include many compositional variations over the basic $ABX_3$ formula. Such compounds as magnesium-iron silicate, calcium uranium oxide, $Ca_2FeTiO_y$, and $Bi_2Sr_2Ca_2Cu_3O_y$ are further examples of perovskite phase materials.

The superconducting perovskite type materials are ceramic based defect oxides. That is, the superconducting phases of the perovskite type materials are solids in which different kinds of atoms occupy structurally equivalent sites, and where, in order to preserve electrical neutrally, some sites are unoccupied, or vacant. Since these vacancies may be filled with mobile oxygen atoms, only local order is prevalent with periodicity existing along the planes. These vacant sites form lattice defects, which defects have, generally, profound affects upon the electrical parameters of the superconducting material and more particularly upon the oxidation states of the copper atoms in the unit cells thereof.

Heretofore, single crystal superconducting perovskite type films could only be grown on a "template," i.e., an underlying substrate characterized by substantially the identical crystallographic lattice structure as that of the superconducting film. The superconducting film deposited on this "template" can thereby be epitaxially grown according to the lattice structure of the substrate. Materials, such as strontium titanate and lanthanum aluminate, which have lattice structures matched to the lattice structures of perovskites, are thus utilized as preferred substrates for the epitaxial growth of superconducting perovskite ceramic-oxide type films. However, because these perovskite substrates are very expensive and provide limited surface area upon which to deposit the superconducting material, they remain laboratory curiosities and have limited practical commercial importance.

Sapphire ($Al_2O_3$) represents an inexpensive substrate characterized by excellent dielectric properties that would be an ideal substrate upon which to deposit superconducting films. Researchers have recently experimented with the deposition of thin films of $YBa_2Cu_3O_7$ superconducting material atop $Al_2O_3$ by laser ablation techniques; however, since $Al_2O_3$ does not have a crystallographic lattice structure matching the lattice structure of the depositing $YBa_2Cu_3O_7$ material, these efforts required the prior deposition of a buffer layer having a matching lattice structure to serve as a template for the epitaxial growth of superconducting material.

An article in the American Institute of Physics, Applied Physics Letters Volume 56, No. 8, pp. 785-787, Feb. 19, 1990, by Char et al, entitled *"Properties of Epitaxial $YBa_2Cu_3O_7$ Thin Films on $Al_2O_3$"* evidences an attempt to deposit superconducting $YBa_2Cu_3O_7$ material directly on $Al_2O_3$ substrates. Even a cursory perusal of that publication reveals that the deposited superconducting $YBa_2Cu_3O_7$ film could not be truly epitaxially grown. Notably, the discrete crystallites of the deposited $YBa_2Cu_3O_7$ film identified therein were not aligned as the full width at half maximum of the rocking curve depicted therein was about 2.5°. In fact, relatively wide dispersions in c-axis and in plane alignments of the superconducting material were noted and found to represent mismatched, nonorthogonal axes present in the surface of the sapphire substrate, vis-a-vis, the superconducting material deposited thereupon. It should therefore be evident that these researchers looked to the lattice of the $Al_2O_3$ substrate to align the axes of the multi-grained superconducting film, and, as stated therein, Char, et al were attempting to overcome the problem of the large lattice mismatch by growing a buffer layer with better crystallographic lattice structure relative to that crystallographic lattice structure of the superconducting $YBa_2Cu_3O_7$ film. As a matter of fact, in that reported attempt of Char, et al to grow said superconducting material directly atop the substrate, the $Al_2O_3$ material was carefully cut along the [1012] plane thereof so as to obtain the best possible lattice match of the sapphire as compared to the superconducting film. Despite this careful attempt at matching lattice structure, Char, et al noted in conclusion that a buffer layer of a more clearly matched crystallographic structure was required in order to grow truly aligned $YBa_2Cu_3O_7$ material atop $Al_2O_3$ substrates.

In fact, these same researchers published a second article in July 1990 following up their initial findings. This second article was published in the American Institute of Physics, Applied Physics Letters, Volume 57, No. 4, pp. 409-411, Jul. 23, 1990, by Char, et al, entitled *"Microwave Surface Resistance of Epitaxial $YBa_2Cu_3O_7$ Thin Films on Sapphire"*. The reported research centered on producing epitaxially grown $YBa_2Cu_3O_7$ films on 500 Angstrom thick $SrTiO_3$ buffer layers which were deposited over $Al_2O_3$ substrates. As clearly stated, this research was conducted so as to more precisely align the discrete crystallites of the superconducting film on an insulating, high quality substrate. Moreover, in order to effect such alignment, Char, et al determined that it was necessary to deposit a $SrTiO_3$ buffer layer which provided the necessary perovskite crystallographic lattice match. Of course, and as one of ordinary skill in the art can readily appreciate, the deposition of a $SrTiO_3$ buffer layer represents a costly, time consuming procedure which would not have been resorted to had Char, et al been satisfied with the degree of crystallographic alignment present without that buffer layer.

Typically, the non-epitaxially grown superconducting perovskite ceramic defect oxide-type films are polycrystalline in nature, i.e., formed of individual superconducting grains columnarly arising from the underlying substrate (See FIG. 10). In prior work, efforts of the instant inventors at aligning these individual grains have resulted in spatial alignment only along the c-axis of the unit cells thereof (See commonly assigned U.S. patent application Ser. No. 442,380 filed on Nov. 28, 1989, entitled "Method of Aligning Grains of a Multi-Grained Superconducting Material,", pending, the disclosure of which is incorporated hereby reference). While such c-axis alignment provided increased current flow as compared to randomly oriented superconducting material, it failed to provide the high current carrying capacity originally anticipated. While the reasons that c-axis alignment of the unit cells of the superconducting material failed to provide the high current carrying capacity originally anticipated will be detailed in subsequent paragraphs, FIG. 10 illustrates the type of columnar growth present in typical polycrystalline superconducting material characterized by such c-axis orientation. It should be immediately apparent to the informed reader that current flowing along the a-b plane cannot travel very far before encountering the high angle grain boundaries separating adjacent crystallites, which high angle grain boundaries effectively restrict current flow thereacross.

The instant inventors also previously disclosed $Y_1$-$Ba_2Cu_3O_7$ superconducting films which were modified by the addition of a "parametric modifier" element to fill structural vacancies. (See commonly assigned U.S. Pat. No. 5,004,725 and entitled "Parametrically Modified Superconductor Material," the disclosure of which is incorporated herein by reference.) These researchers at Energy Conversion Devices, Inc. realized that in order to achieve yet higher critical temperatures, it would be necessary to develop a superconducting material in which the chemistry thereof was engineered so as to alter the local chemical and electrical environment. For example, it has been established that the mobility of oxygen atoms in the $Y_1Ba_2Cu_3O_7$ ceramic based systems is very high and therefore the location of those mobile oxygen vacancies at any point in time contribute to the presence or absence of high $T_c$ superconducting phases. It is this oxygen mobility and changing local environment which results in the unstable electronic properties of this class of superconducting materials. Energy Conversion Devices, Inc. found that the addition of the very small and highly electronegative fluorine atoms effectively occupied lattice sites in the ceramic based fluoro-oxide class of superconducting materials so as to cause "grid lock" and provide an impediment to the mobility of oxygen atoms. The result was a stabilized high critical temperature superconducting material. Zero resistance evidence was provided of superconducting phases in "parametrically modified" materials as high as 155 to 168 Kelvin. Magnetic measurements also indicated the presence of yet higher temperature superconducting phases of said fluorinated superconducting material.

The instant disclosure continues to refer to the "parametric modifier" as an agent capable of modifying the local environmental and/or the local chemistry of the superconducting material in such a manner as to affect one or more parameters which control the level of the critical temperature of the superconducting phase. The parametric modifier may also affect the otherwise shielded orbitals of adjacent atoms of the unit cell, in particular the d orbitals. The parametric modifier can act to produce changes in certain parameters which positively affect the critical temperature, while avoiding otherwise related adverse changes in other parameters which would negatively affect the critical temperature. Thus, normally dependent parameters are uncoupled form one another allowing for human engineering of critical features. The parametric modifier can also serve as a catalytic agent to promote grain alignment and to promote film growth along the a-b basal plane. In summary, fluorine, the parametric modifier element of choice, can act in at least one of three ways to improve superconducting properties in the perovskite, defect oxide class of high $T_c$ materials: (1) fluorine can be incorporated in the superconducting material itself; (2) fluorine can act in the plasma to organize the crystallographic growth of the superconducting material; and/or (3) fluorine can promote basal plane growth and inhibit c-axis growth.

The ability of high $T_c$ superconducting materials to carry high critical current densities is not only of great scientific importance, but has immense economic significance. Initially, researchers were not sure of the current density carrying capabilities of the high critical temperature phases of these high $T_c$ superconducting materials. However, this doubt was resolved by scientists at various laboratories throughout the world who demonstrated experimentally that the high $T_c$ ceramic defect oxide superconducting materials could carry current densities exceeding $10^8$ amperes per square centimeter at 77 k. This was determined by measuring the current density carried by either a single crystal or an epitaxially grown thin film of $Y_1Ba_2Cu_3O_7$ material in a direction of movement parallel to the a-b plane, i.e., perpendicular to the c-axis of the unit cell thereof. However, the single crystal and the epitaxial thin films were found to be strongly anisotropic and could only carry about 10,000 amperes per square centimeter of current in a direction other than along said basal planes.

These experiments indicate that the high $T_c$ grains of the polycrystalline superconducting material are highly unaligned and the current density is limited by the high angle grain boundaries which result from columnar growth of the relatively small grains thereof. This is contrary to previous thinking to the effect that the alignment of the discrete grains of the polycrystalline superconducting material only along the c-axis, vis-a-vis, the basal plane, would be sufficient to produce materials having high current carrying capacities. It is now clear that alignment of the unit cells in the direction of the a-b axis as well as in the direction of the c-axis of the superconducting material is required in order to obtain an aligned current path and provide a superconducting material capable of carrying high current densities.

The extremely anisotropic nature of the high critical temperature superconducting materials, where the current flows preferentially along the Cu—O plane, and the strong chemical reactivity of the material have been the major stumbling blocks in the commercial development of high $T_c$ superconducting materials. It is clear that, randomly oriented polycrystalline film, tape or wire cannot be utilized to carry the high current densities necessary for most commercial applications. Up to now, the high current carrying capability of the high $T_c$ superconducting materials has only been demonstrated with tiny single crystals or on films epitaxially grown on perovskite substrates characterized by a lattice mismatch of less than 2%, such as $SrTiO_3$, $LaAlO_3$, $LaGaO_3$, etc. However, these substrates are too costly for use in the fabrication of commercial devices, are available only in small wafers, and/or possess high dielectric constants and high dielectric losses. Further, such free standing single crystal superconducting materials are many times too small, inherently brittle and inflexible. Accordingly, flexible, epitaxial-like films grown on electronic quality, inexpensive substrates must be utilized in order to make it commercially feasible to fabricate wire or other flexible superconducting material. Further, the routineer will appreciate that in numerous commercial applications, it is necessary that the superconducting material be grown on top of a metallic, highly conductive substrate, such as copper, silver or gold, to avoid a catastrophic failure in the event the superconducting material reverts back to its normal state.

Therefore, an urgent and long felt need has existed for a method of growing single crystal, epitaxial or epitaxial-like thin films of substantially flexible high $T_c$ superconducting material on inexpensive, non-perovskite, good dielectric substrates, such as sapphire or a noble metal, especially if those superconducting films are to be capable of 1) providing high current carrying capacities and 2) being grown in an inexpensive, roll-to-roll, mass production process. It is to satisfy these crucial and long felt needs in the art that the instant invention is directed.

SUMMARY OF THE INVENTION

A new approach to growing a high quality thin superconducting film on commercially viable, i.e., inexpensive, elongated and/or large area substrates is disclosed herein. To deposit device quality, epitaxial-like, high $T_c$ superconducting film, which can carry high critical current densities, on inexpensive, non-perovskite, large area of irregularly shaped substrates, such as $Al_2O_3$, it is crucial (1) to reduce chemical reactivity between the substrate and the superconducting films by reducing the deposition temperature, and (2) to grow superconducting film with unit cell alignment so that current can flow with minimal weak links from the high angle grain boundaries typically present with columnar, polycrystalline films. The instant invention utilizes fluorine as a "parametric modifier" in a laser ablation process to solve these basic problems. It is noteworthy that the laser ablation process disclosed herein is particularly viable for producing high $T_c$ superconducting material because it is an inherently non-equilibrium process. Further, the method described herein, provides for the commercial mass production, roll-to-roll fabrication of high $T_c$ superconducting material on large area and/or inexpensive substrates, regardless of the crystallographic structure of that substrate relative to the crystallographic structure of the high $T_c$ film.

As demonstrated herein, the addition of fluorine as a parametric modifier element significantly increases the alignment of the unit cells along both the c-axis and the basal a-b plane of the perovskite ceramic defect oxide-type superconducting material. This increase in unit cell alignment represents a significant improvement over the random or c-axis alignment reported by other researchers in non-fluorinated $Y_1Ba_2Cu_3O_7$ type superconducting materials. As previously mentioned, fluorine plays an important part in one or more of the following: cleaning or etching potential nucleation centers from the deposition surface, promoting film growth in the basal plane, as a catalytic agent in organizing preferred chemical arrangements in the plasma and in the bulk of the superconducting material by stabilizing non-equilibrium conditions. In this invention, the instant inventors have concentrated on the fabrication of an analog to a large single crystal. Further, since a superconducting film, grown by the techniques disclosed herein has the ability to cover (grow immediately over) impurities present in the depositing film, it is possible to purposely insert magnetic flux pinning centers thereinto. Of the greatest importance, the instant process allows for the growth of epitaxial-like films without using single crystal growth techniques or substrates having a lattice matched to the lattice of the superconducting film being deposited.

The present researchers have hypothesized that the use of fluorine in the laser ablative growth process can serve to prevent or at least minimize the growth of nucleation sites on either the substrate or the depositing film and hence minimize the columnar growth of individual grains in the superconducting material. The reader must appreciate the fact that if numerous nucleation sites are present, discrete columnar polycrystalline grains can be simultaneously grown and basal plane alignment of those discrete columns becomes impossible. By increasing the a-b axis alignment of the material and eliminating the high angle boundaries inherently present with discrete superconducting grains, the ultimate goal of manufacturing thin film epitaxial superconducting materials onto inexpensive flexible wires and other irregularly and/or large area non-perovskite substrates has been achieved.

Fluorine is a well known etching element and by employing a fluorinated target and an optimum power and frequency of laser pulses, nucleation sites can be scavenged from the surface on which the superconducting film is grown, thereby both dramatically decreasing, if not totally eliminating, columnar grain growth and promotion of growth in the a-b plane. As a matter of fact, the process is so effective that impurity phases present in the depositing film are ignored by that depositing film and preferential growth continues in the basal plane until those impurities are completely covered.

The term "epitaxial-like" is used herein to specifically define the type of growth of superconducting material disclosed by the instant process and is to be contrasted with "epitaxial" growth. The term "epitaxial" is well recognized by those skilled in the art to refer to the growth of a crystalline substance on a crystalline substrate in a manner in which the substance mimics the orientation of the substrate. This definition is derived from the Greek components "epi" meaning "on top of" and "taxos", meaning "template". Thus, an epitaxially grown perovskite superconducting material requires a perovskite substrate having a lattice structure specifically matched to the lattice structure of the superconducting material to operate as the growth template. The term "epitaxial-like", as used herein, refers to the growth of a crystalline superconducting material in a manner as if mimicking the orientation of a substrate having an identical lattice structure without the presence of such a substrate lattice structure. Simply stated, an "epitaxial-like" perovskite superconducting material grown on a non-lattice-matched substrate would nonetheless be characterized by a lattice structure identical to the lattice structure which would be present if the material was grown on a perovskite substrate. Thus, "epitaxial-like" growth is substantially identical to "epitaxial" growth of a single crystal of superconducting film without the substrate or template constraints associated therewith.

In this regard, specific reference is made to FIGS. 9-11 of the drawings provided herewith. FIG. 9 is a bright field microphotograph illustrating an epitaxial-like growth pattern. FIG. 10 is a bright field microphotograph illustrating columnar polycrystalline growth and grain boundaries associated therewith. FIG. 11 is a bright field microphotograph showing the effects of impurity phases in fluorinated $YBa_2Cu_3O_7$ superconducting film. It is particularly noteworthy that the impurity phases interfere with the growth of the superconducting film in the a-b plane, thereby creating large high angle grain boundaries and forcing microns of columnar growth before the depositing film is able to cover those phases. Contrary to FIG. 11 (i.e., according to FIG. 9), through the practice of the method of the instant invention, it becomes possible to deposit thin films of high $T_c$, high current density perovskite ceramic defect oxide-type superconducting material on inexpensive substrates and in a continuous, roll-to-roll process which is ideally suited for mass production.

One inexpensive substrate of choice, sapphire ($Al_2O_3$), has extraordinary dielectric properties and is commonly used in many microelectronic applications. However, because heretofore the $YBa_2Cu_3O_7$ superconducting film has interacted chemically with the sapphire substrate to form an interfacial layer, and because of the large lattice mismatch which exists between the hexagonal structure of sapphire and the perovskite structure of the depositing film, the quality of the superconducting material directly deposited on sapphire was not satisfactory. Contrary to work of previous researchers and employing the invention disclosed by the present specification, sapphire can be utilized to provide an economical and commercially significant substrate. While other perovskite substrates (including sapphire substrates with perovskite barrier layers) have been employed as scientific curiosities, due to cost constraints and the small surface areas they provide, those prior art substrates have found no commercial significance. Another inexpensive substrate of choice is silver, which provides good electrical conductivity for preventing catastrophic failures in the event that the superconducting material would revert to its normal state. In this regard, the reader is asked to note that of the noble metals, gold is too soft and expensive and copper reacts with the superconducting material, thereby making silver the preferred, inexpensive and flexible substrate of choice. While the aforementioned substrates represent preferred embodiments, note that the key features of the instant invention is the elimination of the reliance on substrate material and the deposition of the high $T_c$ epitaxial-like superconducting material on any substrate, without regard to the relative lattice structures thereof.

In a preferred embodiment, the superconducting film of the instant invention is ablated from a target pellet by a high energy laser pulse and is deposited onto a substrate operatively disposed in close proximity thereto. In this preferred embodiment, especially tailored for use with a sapphire substrate, a sintered, multiphased target includes $BaF_2$, $CuO$, and $Y_2O_3$ and is utilized to introduce the necessary elements for epitaxially depositing the fluorinated $YBa_2Cu_3O_7$ superconducting film onto said sapphire substrate.

In an alternately preferred embodiment, the superconducting film of the instant invention is also ablated by as high energy laser pulse from a sintered, multiphase target including $Bi_2O_3$, $SrCa_2$, $SrF_2$, $CaF_2$ and $CuO$ to introduce the necessary elements for epitaxially depositing the fluorinated $Bi_2Sr_2Ca_2Cu_3O_y$ superconducting film onto a sapphire substrate disposed in close proximity to the target.

A schematic diagram of the laser ablation system of the instant invention is shown in FIG. 4, said system operatively disposed within an enclosed vacuumized deposition chamber. The target is rotated at a speed of about 10 rpm and non-stoichiometric material is ablated therefrom with pulses from a XeCl excimer laser (lambda=308 nm, tau=30 ns) fired within an optimized frequency and power regime. For instance, the laser can be fired at a frequency of less than 5 Hz and at an energy density of less than about 5 J/cm$^2$. During the deposition process, the chamber is maintained at an oxygen partial pressure of less than 100 mTorr and preferably at about 25-50 mTorr and the substrate holder is maintained at a temperature of approximately 650°-720° C. The substrate, being mechanically clamped to the holder, has a surface temperature 70°-100° C. lower than the temperature of the substrate holder. After the deposition of the superconducting material, the sample is slowly cooled to room temperature.

By ablating material from a fluorinated, non-stoichiometric, $YBa_{2.7}Cu_{2.6}F_{5.4}O_{4.1}$ target, the high quality perovskite-type epitaxial-like superconducting films are not only characterized by having the c-axis of the unit cells thereof oriented perpendicular to the plane of the non-perovskite substrate, but also by the basal plane alignment of the unit cells thereof on the bare $Al_2O_3$ or silver substrate without the presence of an interfacial layer therebetween. The superconducting film of the instant invention exhibits excellent normal state metallic properties, a very sharp superconducting transition with a $T_c$ (R=O) of 86-88 K., and a critical current density of $1.5 \times 10^5$ Angstroms/cm$^2$. Further, the magnetic field dependence of Jc (H)/Jc(O) indicates that the epitaxial grown, single crystal superconductors demonstrate strong flux pinning along the basal plane (up to H=10 Tesla).

By ablating material from a fluorinated, non-stoichiometric $Bi_2Sr_2Ca_2Cu_3O_y$ target, a second high quality perovskite type epitaxial-like superconducting film, characterized by the c-axis alignment of the unit cells thereof perpendicular to the plane of the non-perovskite substrate and the basal plane alignment of the unit cells thereof on the bare non-perovskite substrate without the presence of an interfacial layer therebetween. This alignment is shown by the graphic representation of relative intensity of x-ray diffraction patterns in FIG. 14.

These and other objects and advantages of the present invention will become apparent from the detailed description of the preferred embodiment of the present invention which follows hereinafter.

BRIEF DESCRIPTION OF THE DRAWINGS

FIG. 4 is a schematic representation of the laser ablation system used in one embodiment of the present invention, said representation illustrating the relative disposition of the major components of the system employed in the fabrication process;

FIG. 5 is a schematic diagram of the laser ablation system used in a second embodiment of the present invention, said representation illustrating a roll-to-roll process in which an elongated roll of substrate material is continuously moved through the deposition region;

FIG. 6 is a schematic representation of the laser ablation system used in a third embodiment of the present invention in which a plurality of target/laser systems are utilized to deposit uniform films of different superconducting material atop large area or irregularly shaped substrates;

Figure 12:
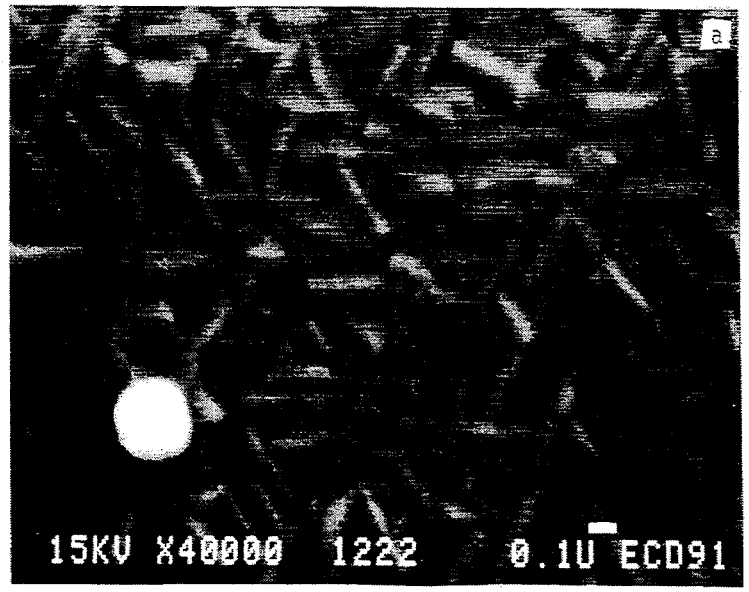
Figure 13:
Figure 14:
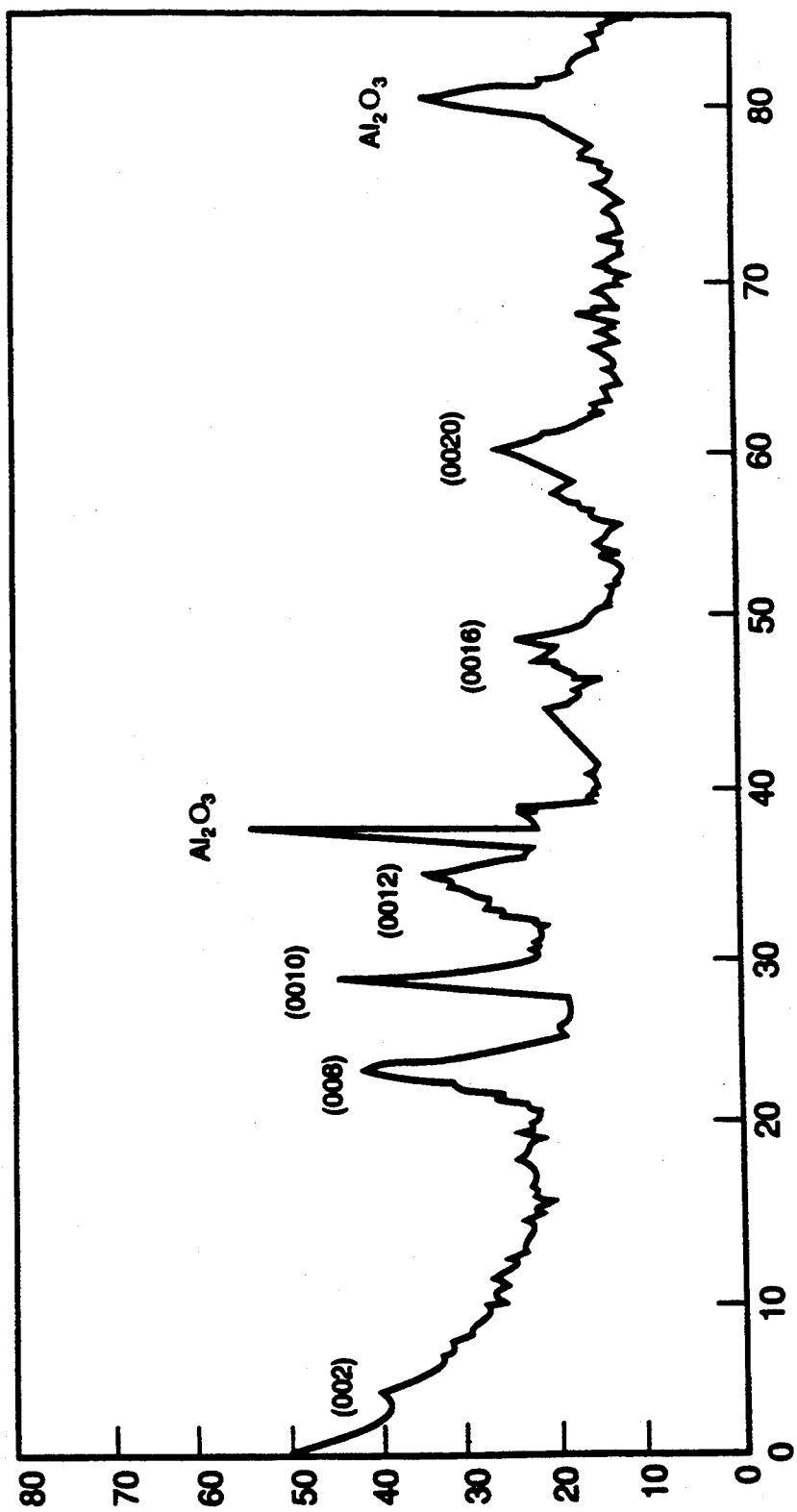
Figure 15:
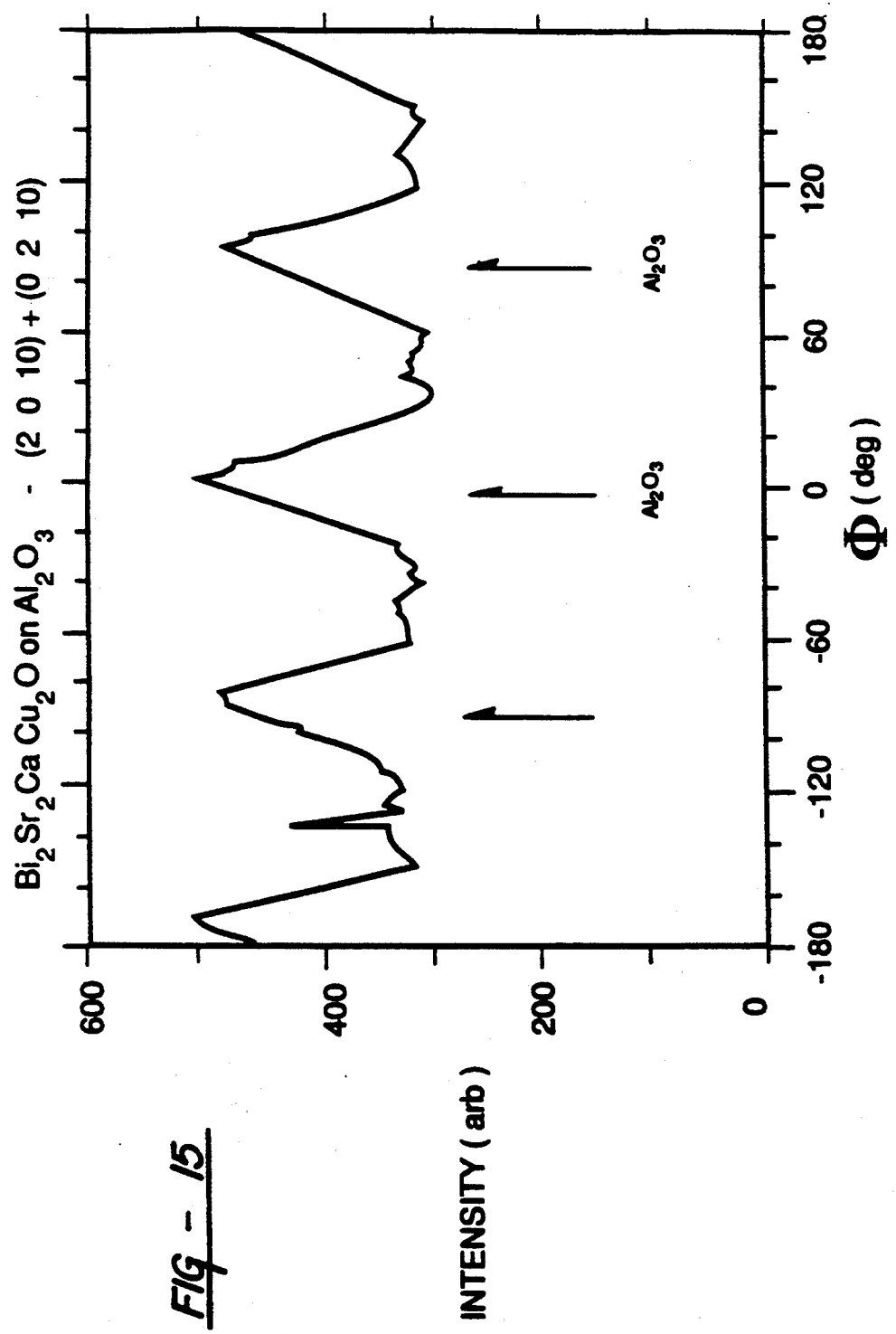
Figure 16:
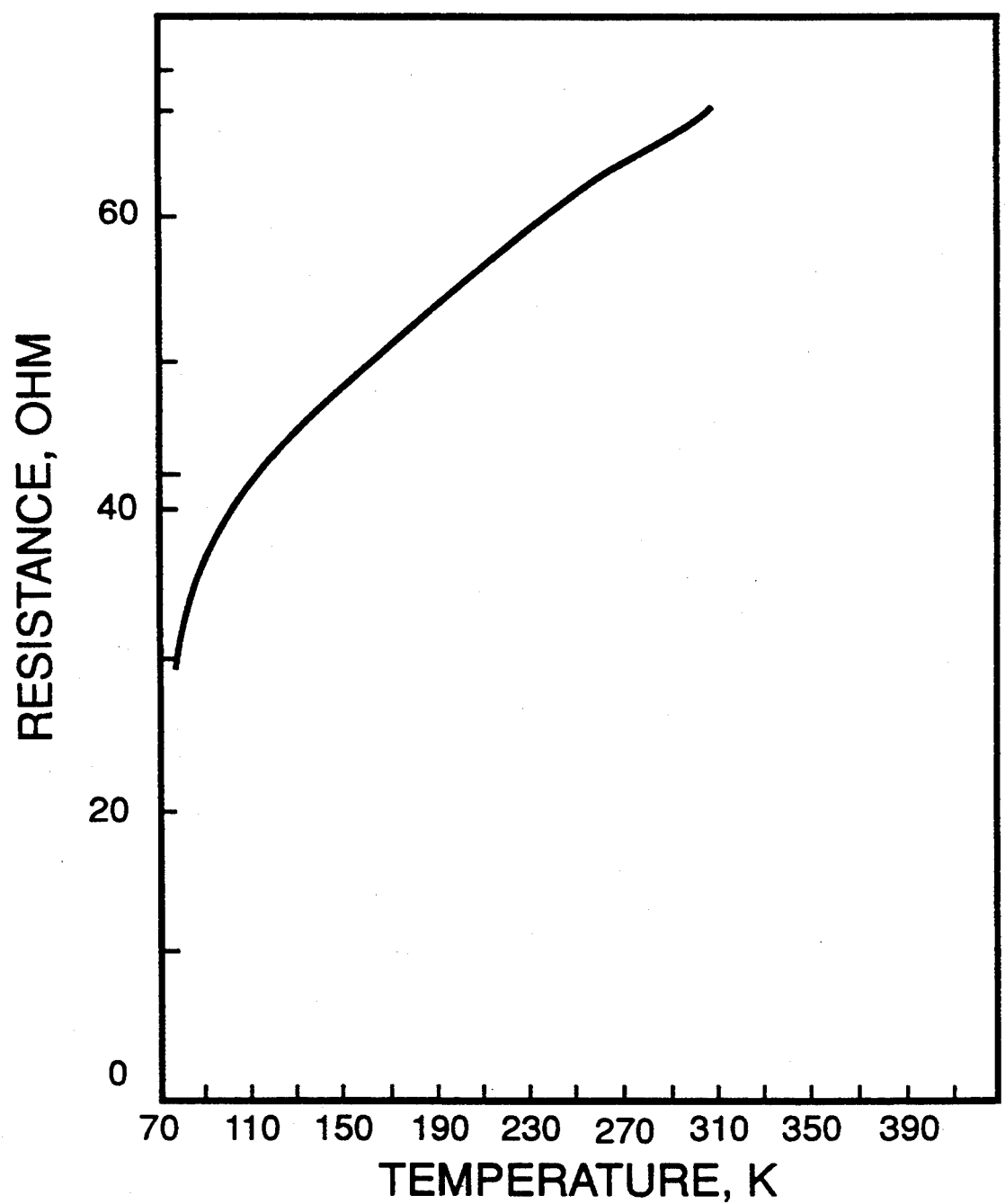
Figure 17:
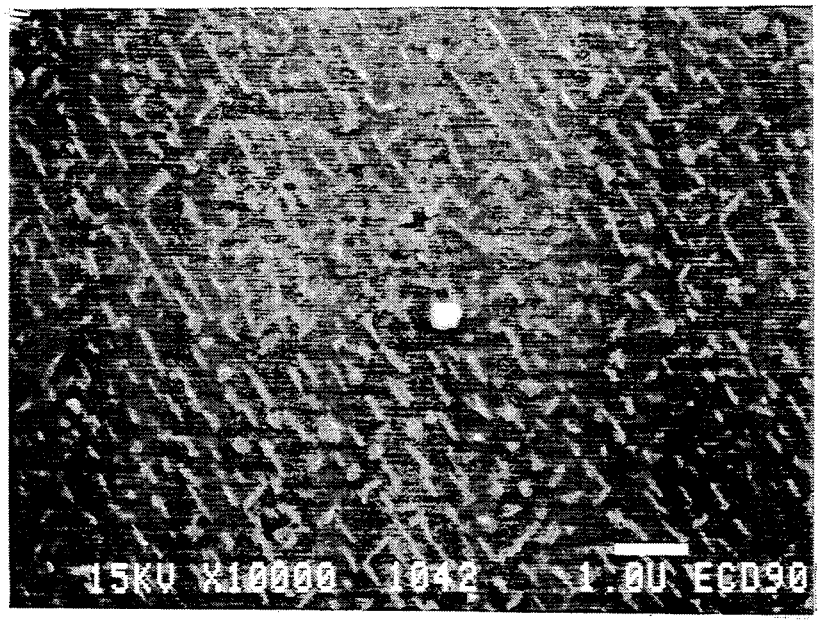
Figure 18:
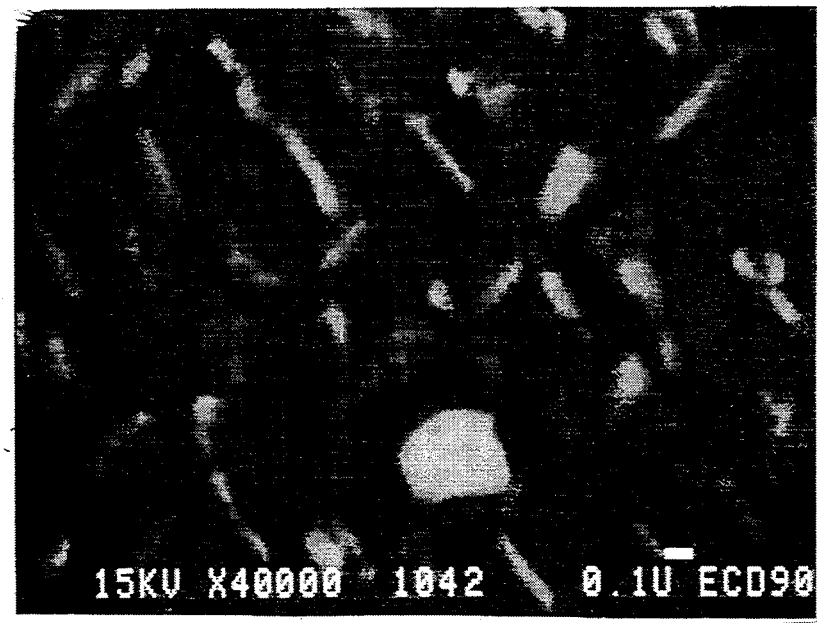

Cu₃O₇ superconducting film of the prior art and illustrating the effect of impurity phases incorporated into the bulk of the depositing film;

FIG. 12 is a bright field SEM microphotograph of the surface morphology of a superconducting film deposited on a 1.8 micron silver layer disposed on a mica base from a nonfluorinated YBaCuO target at 680° C. and 50 mT;

FIG. 13 is a bright field SEM microphotograph of the surface morphology of a fluorinated YBaCuO superconducting film on a 1.8 micron silver layer disposed on a mica base from a fluorinated YBaCuO(F) target at 680° C. and 30 mT;

FIG. 14 is a graphic representation illustrating the relative intensity of scattered x-rays plotted on the ordinate verses degrees two theta plotted on the abscissa; said representation showing the nature of the fluorinated $Bi_2Sr_2Ca_2Cu_3O_y$ material of the second embodiment of the instant invention;

FIG. 15 is a graphic representation of the relative intensity of scattered x-rays plotted on the ordinate verses 360° $\Phi$ plotted on the abscissa; said representation showing the nature of the fluorinated $Bi_2Sr_2Ca_2Cu_3O_y$ material of the second embodiment of the instant invention;

FIG. 16 is a graphic representation of the normalized resistance plotted on the ordinate verses temperature plotted on the abscissa for the $Bi_2Sr_2Ca_2Cu_3O_y$ superconducting film of the instant invention;

FIG. 17 is a bright field SEM microphotograph (power X10,000) of the surface morphology of the as-deposited epitaxial-like fluorinated $Bi_2Sr_2Ca_2Cu_3O_y$ superconducting thin film of the second embodiment of the instant invention; and FIG. 18 is a bright field SEM microphotograph (power X40,000) of the surface morphology of the as-deposited epitaxial-like fluorinated $Bi_2Sr_2Ca_2Cu_3O_y$ superconducting thin film of the second embodiment of the instant invention.

DETAILED DESCRIPTION OF THE PREFERRED EMBODIMENT

It is important to controllably introduce an alignment inducing modifier element, such as fluorine, into the unit cells of superconducting material so as to occupy either vacant lattice sites or to partially substitute for oxygen atoms in those lattice sites which are otherwise occupied by oxygen atoms in conventionally formed material (or both). The chemical introduction of fluorine is theorized to increase the thermodynamic stability of the ceramic based fluoro-oxide superconducting material, while significantly increasing the alignment of unit cells along the a, b and c-axis of at least the high $T_c$ superconducting phases of the material. The instant inventors have developed a method of introducing the alignment inducing, columnar growth inhibiting, parametric modifier element fluorine into the high $T_c$ superconducting material through a process, such as laser ablation, that can advantageously be applied to other thin film deposition techniques so as to render it possible to deposit thin film, flexible, high $T_c$ epitaxial-like superconducting material on irregularly shaped substrates having a lattice structure different than the lattice structure of the superconducting film.

The method disclosed in the instant invention relates to a solid state reaction in which the precursor compound of the alignment-inducing parametric modifier element can be introduced either by a metallic or a non-metallic compound containing fluorine; the precursor compound is capable of incorporating fluorine into the perovskite ceramic based defect oxide-type material without otherwise deleteriously effecting the propensity of that perovskite precursor mixture to form a superconducting material. Preferably, the source of the parametric modifier, i.e., the fluorine containing compound, is chemically stable at standard temperature and pressure and is capable of being excited in the laser ablation process first to effuse fluorine atoms or fragments into the deposition environment and, where necessary, to reintroduce at least some fraction of said element into the superconducting material. Note that, as explained hereinabove, it is not necessary that a large atomic percentage of fluorine be incorporated into the superconducting material; but rather that fluorine be introduced into the plasma so as to cleave nucleation sites from the deposition surface and promote basal plane growth, vis-a-vis, columnar growth. It is also possible to substitute a gaseous form of fluorine, atomic, molecular or excited, to at least partially replace the metallic fluorine containing compound without departing from the spirit or scope of the instant invention.

The laser ablation process induces a solid state reaction to occur between the compounds of the precursor mixture, thereby forming a perovskite epitaxially grown superconducting material. In a first preferred embodiment, said perovskite material is of the ceramic based defect oxide type and represented by the generic formula $M_vIIA_wIII_M_xIBO_y$, wherein $M^{IIA}$ is a Group IIA metal, $M^{IIIA}$ is a Group IIIA metal, $M^{IB}$ is a Group IB metal, O is oxygen, v is approximately 2, w is approximately 1, x is approximately 3 and y is in the range from 5.5 to 9.0, and more specifically by the formula $Y_1Ba_2Cu_3O_7$. Alternatively, in a second preferred embodiment the material is represented by the formula $Bi_2Sr_2Ca_2Cu_3O_y$, wherein O is oxygen and y is in the range from 5.5 to 9.0.

Laser-assisted evaporation has been previously used to deposit thin films of semiconductors and dielectrics, and more recently to deposit thin superconducting films. The deposition process utilizes a high power, pulsed laser to ablate material from the face of a target pellet onto a nearby substrate. Conventionally, a target pellet is mounted in the range of 1-8 cm, and preferably 5 cm, from a heated substrate under vacuum (approximately $1 \times 10^{-6}$ Torr) and irradiated by pulsed light from an externally mounted excimer laser. A window in the vacuum chamber allows the excimer beam to irradiate the target. The excimer beam is focused through a cylindrical lens to produce peak power intensities of about 200 mW/cm². The high local fields produce a plasma at the deposition surface of the target pellet and a visible plume of excited ejected particles extending toward the substrate. Typical thicknesses of the deposited superconducting film range from about 0.1 to 3.0 micrometers. The substrate is heated to allow surface mobility of the depositing species while limiting oxygen out-diffusion. After deposition, most films require conventional annealing in an oxygen atmosphere to become metallic and superconducting.

In the preferred embodiment of the present invention, the process remains essentially the same; however, the pressure is maintained relatively low and a pulse/frequency power regime is optimized so that the fluorine atoms and radicals have optimal time and energy to etch the deposition surface of nucleation centers and promote film growth along the basal plane of the substrate.

Preferably, the oxygen pressure is maintained in the range of about 25 to 50 mTorr and the frequency between laser pulses is maintained at less than about 5 Hz and preferably between about 0.1 to 3 Hz. As a matter of fact, the instant inventors have discovered that too high a combination of energy and frequency prevents fluorine from effectively etching nucleation sites from the deposition surface and enables columnar growth of polycrystalline material to begin.

As shown in FIGS. 4-6, several types of laser ablation systems can be utilized in practicing the invention described herein. Of course, the type of system is dependent, at least in part, on the dimensions and shape of the substrate. Typically, the effective deposition region produced by laser ablating a single 1 inch diameter target pellet is approximately 2 cm$^2$. For a small substrate, a system having only one target pellet, as shown in FIG. 4, is sufficient. For relatively thin, continuous rolls of substrate material, such as wire or tape, a system in which the roll of substrate material is continuously advanced through the deposition region to have uniform continuous flexible superconducting films deposited thereon, as shown in FIG. 5, can be employed. In a particularly important embodiment of FIG. 5, the substrate is a thin roll of silver coated wire upon which 1 to 3 microns of flexible superconducting material is continuously deposited. Because of the continuous movement of the wire through the deposition region, the deposited superconducting material will be very uniform. Note that it is possible to employ multiple laser assemblies to deposit a thicker coating of superconducting material as the elongated wire sequentially or continuously moves past the multiple deposition regions. For instance, the roll of substrate material might include silver coated regions such as 10a and 10b which are sequentially coated with superconducting material as the roll moves therepast. The multiple systems can be spacedly disposed in a single chamber or in discrete chambers.

Further, a multiple number of spacedly disposed targets can be simultaneously ablated (as shown in FIG. 6) by a corresponding number of multiple lasers to increase the effective area for depositing superconducting material onto irregularly shaped or larger area substrates. Different targets could be fabricated from different superconducting, metallic or insulating materials so that actual devices or alternating layers could be formed as a consequence of the continuous or sequential movement of substrate material through one or more contiguous deposition regions. Also note that while the foregoing discussion deals primarily with a single roll of substrate material, multiple discrete substrates could also be sequentially passed through the deposition region without departing from the spirit or scope of the invention. For instance, cassettes of discrete substrates could be introduced into the vacuum chamber and processed in the aforedescribed manner. Further, the deposition techniques of the instant invention can be employed to grow thick epitaxial-like high $T_c$ superconducting films on flexible substrates for large volume high field applications. In this connection, note that heretofore, the randomly oriented polycrystalline superconducting films of the prior art could not provide the current density required for electronic device applications. Also note that the use of a high quality electrically conducting substrate upon which to grow the epitaxial-like superconducting films of the instant invention is advantageous so that catastrophic failures are prevented in the event the superconducting film returns to its normal state.

EXAMPLE 1

A sample target of a perovskite defect oxide type of superconducting material comprising metal species and oxygen in combined form was prepared in a parametrically modified, fluorinated state. Thereafter, through the use of the aforementioned laser ablation technique, a fluorinated superconducting $Y_1Ba_2Cu_3O_7$ film was grown from material evaporated from the sample. The properties of the superconducting fluorinated film were subsequently compared to a superconducting film similarly fabricated from a non-fluorinated sample target so as to determine the effect of the parametric modifier element (fluorine) on the superconducting characteristics of perovskite ceramic defect oxide type materials (maintaining all other conditions of deposition identical).

The fluorinated sample of superconducting material was initially prepared by blending specifically selected compounds to form a perovskite defect oxide type precursor mixture. Specifically, the precursor mixture contained the following compounds, which were weighted out on paper in the following proportions, and were poured into an unglazed, Coors CH-50-65504-7 crucible, as follows:

| Powder | Actual Weight | Source |
| --- | --- | --- |
| $Y_2O_3$ | 2.8496 grams | Metals Mart, Lot R4, (5-6 nines purity) |
| $BaF_2$ | 11.9376 grams | Alfa Ultrapure, Lot 050385 |
| CuO | 5.2159 grams | Metals Mart, Lot 2688, (3 nines purity) |
| Total | 20.0031 grams | |

The mixture of the perovskite precursor materials was blended with a pestle in the unglazed crucible, packed into the bottom of the crucible, and then heated in air at standard pressure in a preheated 930° C. furnace. At various intervals, the mixture was removed from the furnace, cooled, and reground to ensure thorough blending of the mixture compounds, and then reinserted into the 930° C. furnace, according to the following time regime:

| Time | Activity |
| --- | --- |
| 19 hours, 52 minutes | 930° C. furnace removed, cooled, reground |
| 4 hours, 40 minutes | 930° C. furnace removed, cooled, reground |
| 17 hours, 4 minutes | 930° C. furnace removed, cooled, reground |
| 6 hours, 32 minutes | 930° C. furnace |
| Total 48 hours, 8 minutes | |

After the foregoing regime of heating was completed, a ten gram sample of the mixture was pressed into a pellet-like configuration for use as the target in the laser ablation apparatus, described in detail hereinafter. Ten grams of the compound mixture was weighed and was inserted into a drill stock die and compressed in stages to form a pellet. The stages of compressing the mixture into a one inch diameter pellet occurred as follows:

| Pressure | Time |
| --- | --- |
| 5 tons | momentarily |
| 10 tons | momentarily |
| 15 tons | momentarily |
| 20 tons | five minutes |

After being compressed according to the above schedule, the pellet showed no visible signs of cracking. The pellet was then subjected to a sintering process, wherein the pellet was placed on $YBa_2Cu_3O_7$ bars, loaded onto an alumina carrier, and heated in an extra dry oxygen furnace, having an $O_2$ flow rate of 1 standard cubic centimeter per second, at ambient pressure of 100 mTorr, according to the following schedule:

| Time | Temperature |
| --- | --- |
| 12 hours | Ramped from 200° C. up to 950° C. |
| 16 hours | 950° C. |
| 8 hours | Ramped from 950° C. to 200° C. in situ |

After completion of the sintering process, the pellet was removed, stored in a dessicator and finally employed as the target in the laser ablation process.

Figure 9:
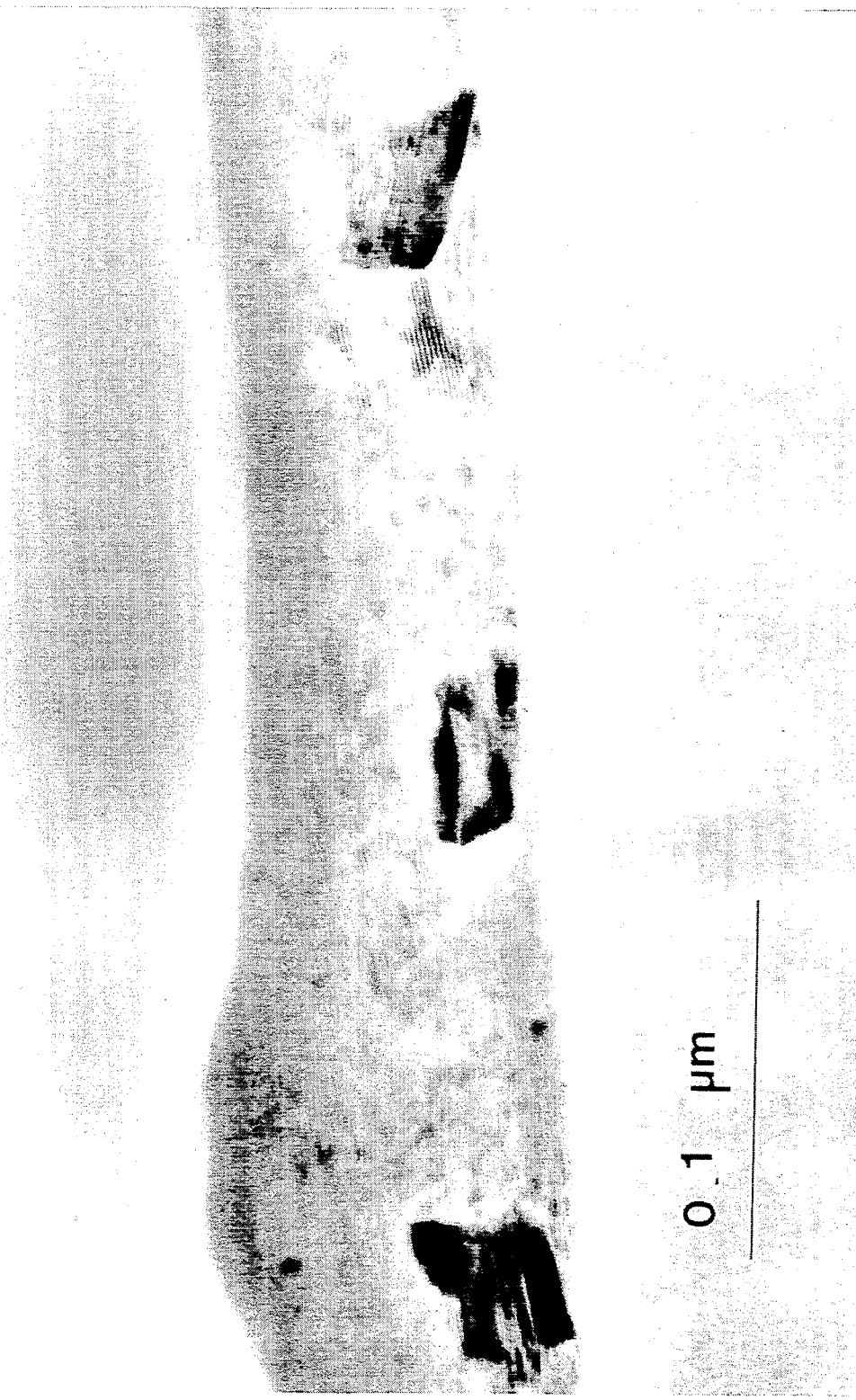
FIG. 9 is a bright field TEM cross-sectional microphotograph of an as-deposited epitaxial-like fluorinated $YBa_2Cu_3O_7$ superconducting thin film of the instant invention.

The epitaxial-like superconducting films were prepared using the aforementioned laser ablation technique. While previously mentioned, the reader must bear in mind that the term "epitaxial-like" as used herein, refers to the type of growth of high $T_c$ superconducting ceramic defect oxide-type material experienced on non-perovskite substrates, i.e., substrates whose lattice structure is not matched to the lattice structure of the superconducting material. This type of epitaxial-like growth can best be understood by referring to the bright field TEM microphotograph of FIG. 9 which illustrates the $YBa_2Cu_3O_7(F)$ superconducting film grown on a sapphire substrate. As can be seen from a perusal of that microphotograph, no crystallites, high angle grain boundaries or columnar grain growth is visible. The film growth is virtually indistinguishable from and analogous to true single crystal epitaxy on perovskite substrates. There is practically no interfacial barrier layer between the substrate and the deposited superconducting film.

Figure 11:
FIG. 11 is a bright field TEM cross-sectional microphotograph of an as-deposited polycrystalline $YBa_2$-

Further, it is essential to note the presence of the impurity phases adjacent the substrate/superconducting material interface, relative to the growth of the superconducting film thereabout. The complete encapsulation of those impurity phases due to the epitaxial-like growth of the superconducting material gives rise to a unique and synergistic result, namely that the depositing film grows as though the impurity phases were not even there. Indeed, the surface grows to a mirror-like finish, without the presence of any cracks (the instant inventors hypothesize that the absence of cracks is due to the strain relief inherently provided by the process of the instant invention). Contrary to the impediment to epitaxial growth illustrated in the photomicrograph of FIG. 11, the impurity phases illustrated in FIG. 9 fail to impede epitaxial growth of the superconducting film. Again, the instant inventors believe (although not intending to be bound by speculation), that this phenomena is due to the etching behavior of fluorine atoms and radicals which scavenge nucleation centers from the exposed surface, thereby not only preventing columnar grain growth, but promoting superconducting film growth in the basal plane.

Returning now to the laser ablative process, the sintered target, having multiphase components of $BaF_2$, CuO and $Y_2O_3$, was positioned in a conventional vacuumized chamber (not illustrated), rotated at 10 rpm and material ablated therefrom with pulses from a XeCl excimer laser (lambda=308 nm, tau=30 ns) fired at about 0.3 Hz. The laser energy density was maintained at about 3 $J/cm^2$. During the deposition process, the chamber was maintained at an oxygen partial pressure of 50 mT and the substrate holder was maintained in the range of about 650° C. to 680° C. The sapphire substrate, being mechanically clamped to the holder, has a surface temperature of 70°-100° lower than the temperature of the substrate holder. Due to the lower temperature of the substrate surface, a sapphire substrate may be employed without the elements thereof chemically reacting with the elements of the fluorinated $YBa_2Cu_3O_7$ superconducting material. Following the deposition process, the sample was slowly cooled to room temperature in approximately 40 minutes.

The sample film of superconducting material so produced was thereafter tested to determine the effect of the parametric modifier, fluorine, in the aforedescribed process. This testing generally compared the fluorinated $YBa_2Cu_3O_7$ superconducting film of the instant invention (as grown on sapphire substrate having a hexagonal crystallographic lattice structure) to conventional polycrystalline, non-fluorinated films of superconducting $YBa_2Cu_3O_7$ material on perovskite substrates.

The electrical transport properties of the resulting fluorinated ceramic defect oxide-type superconducting film was measured by a standard four-probe dc measurement. The critical current density was measured on a $0.2 \times 2$ mm line defined by a laser scribing technique. The quality of the superconducting film and the interfacial reactions thereof with the substrate were studied using a JEOL 2000FX analytical electron microscope equipped with a Kevex Quantum light element x-ray detection system. Cross-sectional specimens were prepared by bonding two slices of the substrate and superconducting film together with epoxy so that the film sides were operatively disposed in face to face relation. This was followed by mechanical polishing, dimpling and argon ion milling with liquid nitrogen cooling. The critical current density carried by the standard superconducting $YBa_2Cu_3O_7$ film and the fluorinated superconducting film, measured at 77K on a laser patterned stripe of $0.2 \times 2$ mm, are $5 \times 10^3$ and $1.5 \times 10^5$ $A/cm^2$, respectively. In other words, the fluorinated ceramic defect oxide-type superconducting film, prepared in the aforementioned manner, showed an increase in current density by a factor of over 300.

Figure 1:
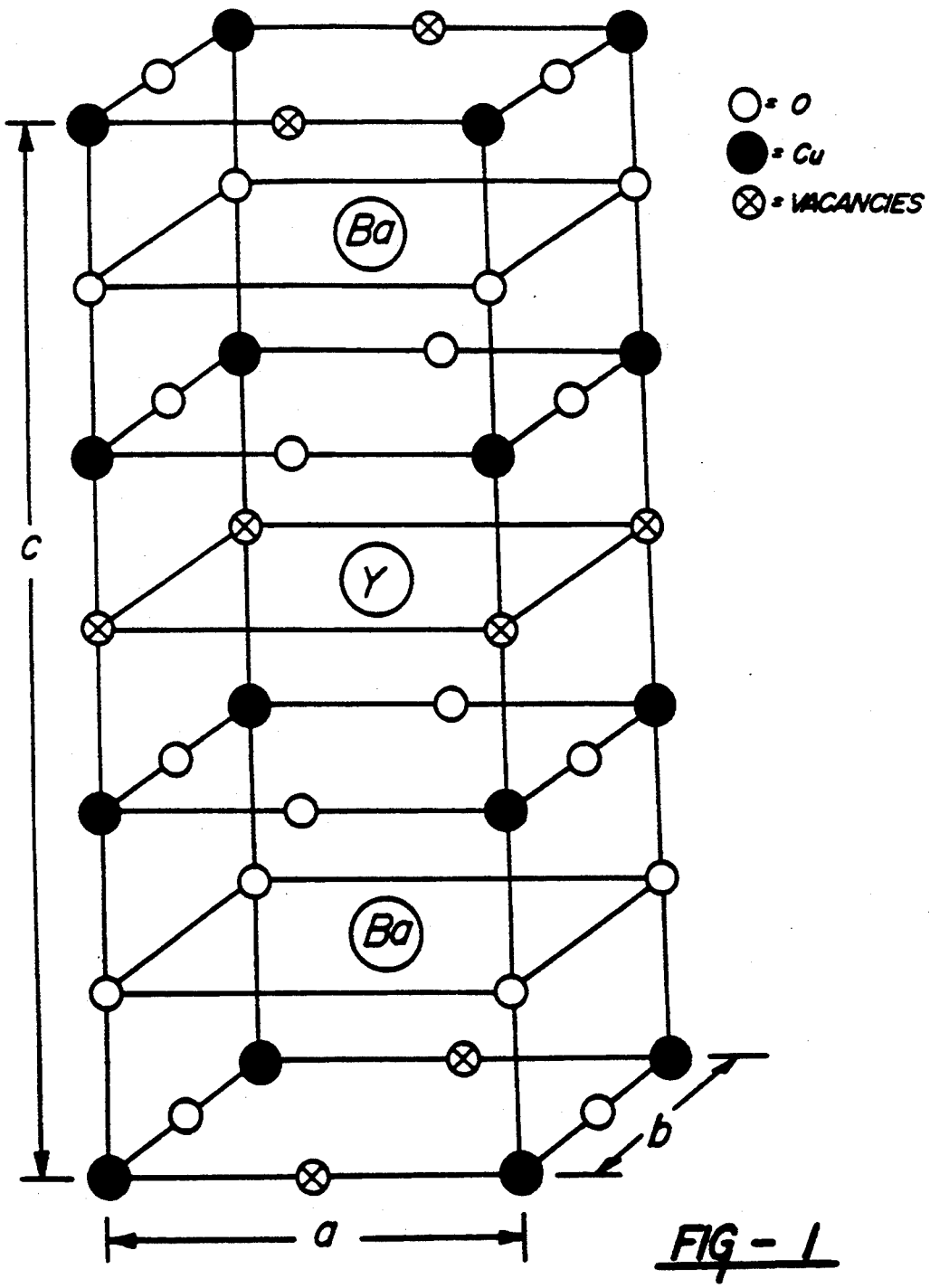
FIG. 1 is a stylized illustration of the typical unit cell structure of a ceramic based defect oxide, perovskite-type superconducting material characterized by the composition $M^{IIIA}M^{IIA}M^{IB}O_y$ and specifically depicting the oxygen vacancies present in the CuO planes of that unit cell.
Figure 2:
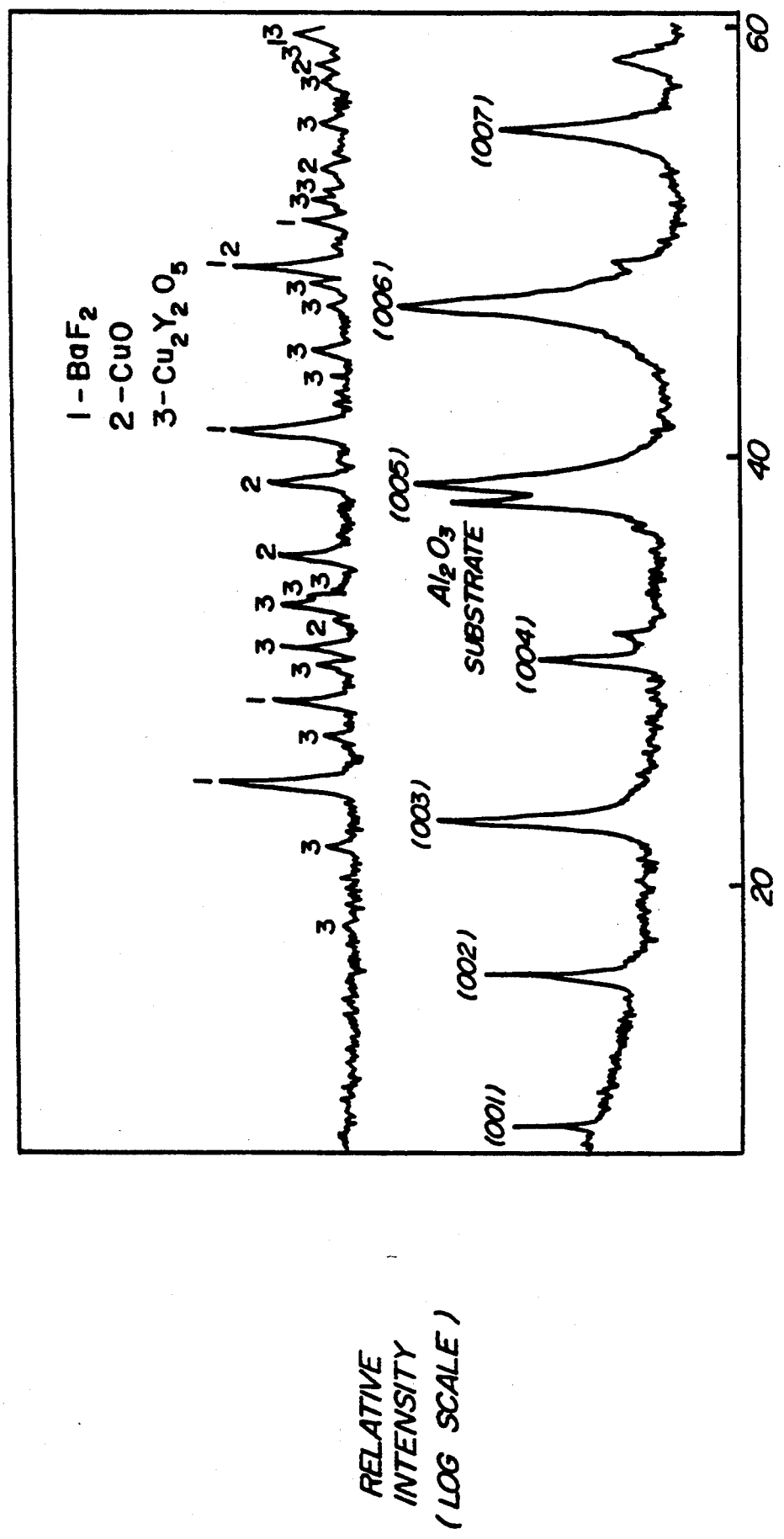
FIG. 2 is a graphic representation of Relative Intensity plotted on the ordinate verses Degrees Two Theta plotted on the abscissa; said representation showing the multiphasic nature of the target in the upper plot and the virtually single phasic nature of the substrate in the lower plot.

Referring now to the drawings and particularly to FIG. 2, there is illustrated the x-ray diffraction pattern of a fluorinated target pellet in the upper trace thereof. The multiphasic nature of the target pellet, which consists of $BaF_2$, CuO, and $Cu_2O_3$, is clearly seen from the diffraction data. The x-ray diffraction pattern of a laser ablated superconducting film fabricated from the fluorinated target is shown in the lower trace of FIG. 2. It is interesting to note that the superconducting film generated from the multiphasic target, which contains no superconducting phase, is virtually "single phase". Only the (00) diffraction peaks along with an $Al_2O_3$ substrate peak are detected. The two most intense diffraction peaks of a completely random diffraction such as (103) and (013)/(110) are hardly seen, indicating that the c-axis of the fluorinated superconducting film is predominately normal to the basal plane of the substrate. Not surprisingly, the fluorine content in the film was small, being just beyond the detection limit of the electron microprobe, i.e., about 0.1 atomic percent. However, the presence of fluorine was clearly detected utilizing the SIMS technique. In this regard, note that a large percentage of the fluorine present in the target pellet is lost to the chamber during the laser ablation process. Nevertheless, the fluorinated superconducting films ablated from the fluorinated 123 target pellet consistently show better electrical transport properties than those ablated from a non-fluorinated single phase 123 target pellet. It is for this reason that the instant inventors come to the inescapable conclusion that fluorine is playing a major role in organizing film growth in the plasma as well as cleaning the surface of nucleation centers which would otherwise initiate columnar growth of the superconducting film.

Figure 3:
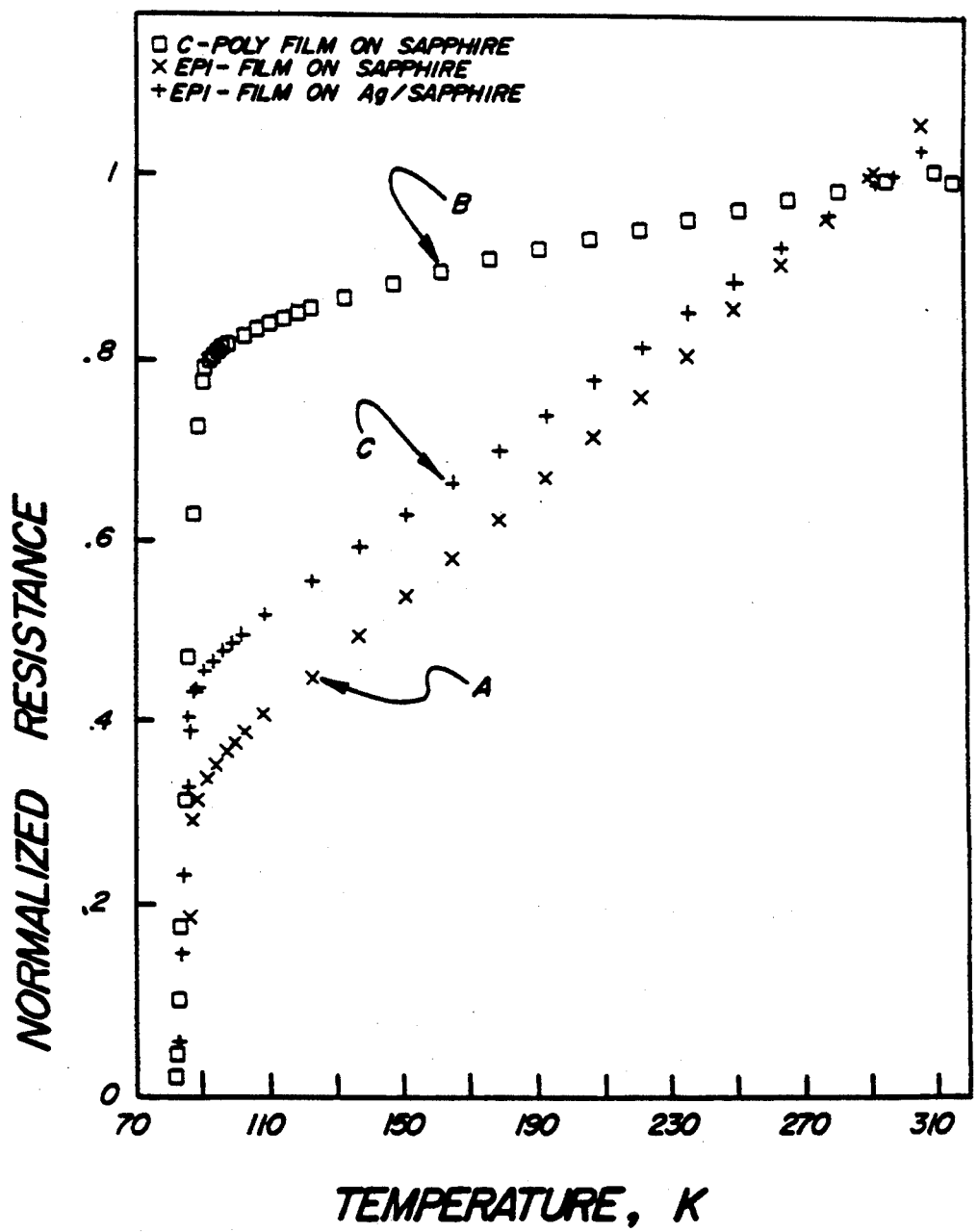
FIG. 3 is a graphic representation of Normalized Resistance plotted on the ordinate verses Temperature (in Kelvin) plotted on the abscissa; said representation comparing the normalized resistance of the fluorinated superconducting $YBa_2Cu_3O_7$ film of the present invention as laser ablated from a multiphase fluorinated target to the normalized resistance of a polycrystalline $YBa_2Cu_3O_7$ film deposited from a single phase non-fluorinated target.

FIG. 3 is a graphic comparison of the transition to the superconducting states of two laser ablated superconducting films. The fluorinated $YBa_2Cu_3O_7$ superconducting film was deposited from the multiphased fluorinated target pellet and the standard $YBa_2Cu_3O_7$ superconducting film was from a single phase non-fluorinated target pellet. The deposition conditions, under which both of these films were deposited, were kept the same. The films were grown to about 0.3 micrometers thickness. The standard non-fluorinated $YBa_2Cu_3O_7$ superconducting film depicted by reference arrow B showed an onset temperature of 88 K. and $T_c(R=O)$ at 82 K., whereas the fluorinated $YBa_2Cu_3O_7$ film depicted by reference arrows A and C showed an onset at 94 K. and $T_c(R=O)$ at least as high as 88 K. Furthermore, the much steeper normal state resistivity-temperature slope of the fluorinated $YBa_2Cu_3O_7$ superconducting films of graphs A and C indicate superior metallic behavior. This steeper slope is known by those skilled in the art to be the fingerprint of epitaxially grown superconducting films. Accordingly, the steep slope depicted by the arrow C is proof that the film grown on a silver substrate is both superconducting and epitaxial.

Figure 7:
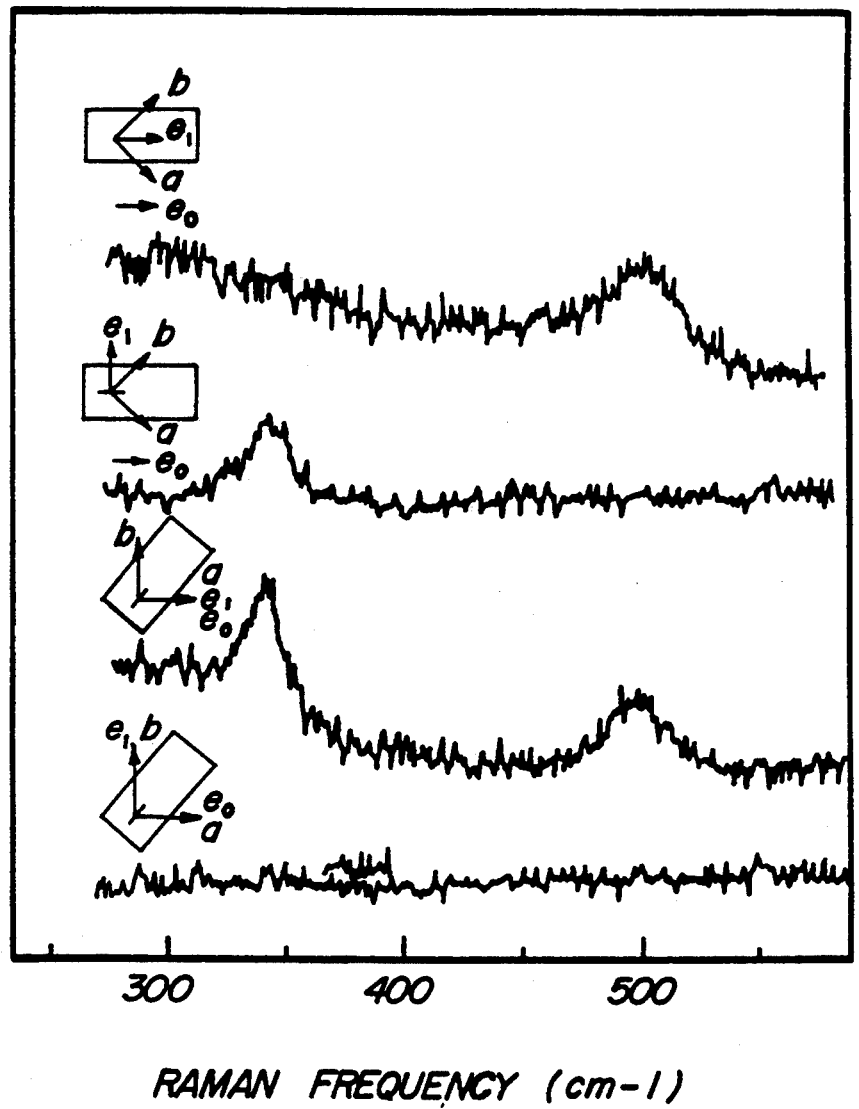
FIG. 7 is a graphic representation of Raman Spectroscopy Intensity plotted on the ordinate versus Raman Spectroscopy Frequency plotted on the abscissa for fluorinated $YBa_2Cu_3O_7$ superconducting film deposited on a sapphire-substrate to show the relationship of the a-b axis of the film versus the electric sector of incident and scattered radiation always lie in the basal plane of the unit cells of the superconducting film.

In FIG. 7, Raman spectroscopy was employed to investigate crystal structure and in-plane axes orientation of the laser ablated, fluorinated superconducting films. It is known that if the sample exhibits crystal-like properties, the polarization of the scattered radiation can be analyzed subject to the selection rules which depend on the crystal structure. The polarization characteristics of the 500 cm$^{-1}$ and 335 cm$^{-1}$ Raman lines of the $Y_1Ba_2Cu_3O_7$ crystal can be used to determine whether the crystal axes are oriented and if so, the direction of that orientation. FIG. 7 shows a set of Raman spectra for the fluorinated $YBa_2Cu_3O_7$ superconducting film grown on sapphire pursuant to the aforementioned process. The electric vector of the incident (Ei) and scattered (Esj) radiation are always in the basal plane of the superconducting film, which film is about 2000 Å thick, 4 mm wide and 12 mm long. The c-axis of the superconducting film is perpendicular to the plane of the substrate. As can be seen from FIG. 7, the 335 cm$^{-1}$ mode is completely absent in the (a) and (d) traces, whereas the 500 cm$^{-1}$ mode is absent in the (b) and (d) traces. These spectra exhibit the same polarization behavior as a single crystal, thereby further confirming that the growth of the laser ablated superconducting film is epitaxial-like. The a-b axes (lying in the basal plane) of the film is definitely shown to be nearly 45° to the side of the substrate.

Figure 8:
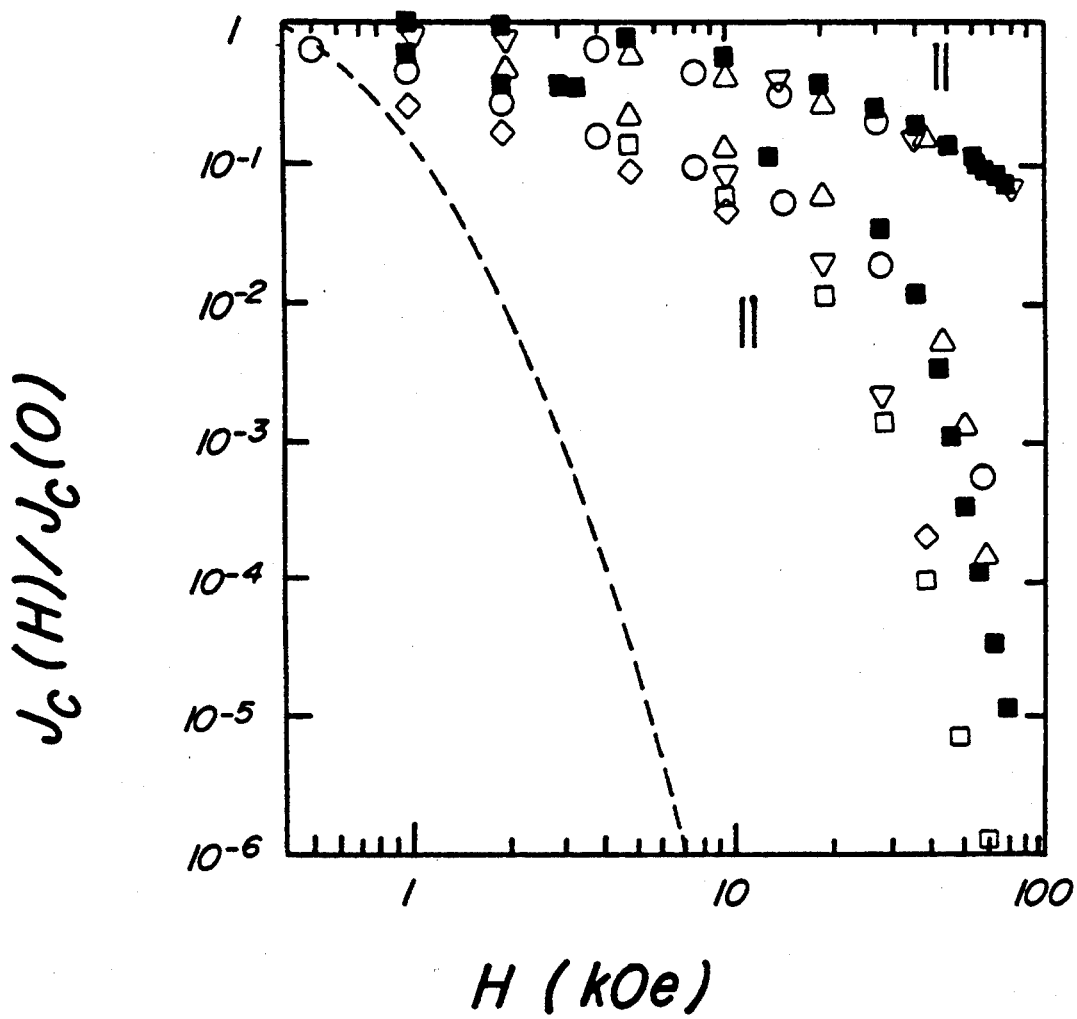
FIG. 8 is a graphic representation of magnetic field dependance of various superconducting films in which the ratio of Jc(H)/Jc(O) is plotted on the ordinate and H is plotted on the abscissa.

With reference to FIG. 8, the magnetic field dependence of the fluorinated $YBa_2Cu_3O_7$ superconducting film further confirmed the conclusion that said fluorinated superconducting film grown on sapphire (hexagonal substrate) is similar to the magnetic field dependence of an epitaxial superconducting film grown on $SrTiO_3$ and $LaAlO_3$ (perovskite substrates). The conclusion is that the instant inventors have grown epitaxial superconducting films without the benefit of a template affect from the substrate and without the presence of interfacial buffer layers.

Figure 10:
FIG. 10 is a bright field TEM cross-sectional microphotograph of an as-deposited polycrystalline $YBa_2Cu_3O_7$ superconducting film of the prior art and illustrating columnar crystalline growth and grain boundary resistance to high current conduction.

It is essential to note that the superior electrical conductivity of the fluorinated $YBa_2Cu_3O_7$ superconducting film is attributed to the fact that the fluorine promotes epitaxial-like growth, whereas columnar growth is dominant in the non-fluorinated films. The bright field TEM images from the cross-sectional microphotographs of the standard $YBa_2Cu_3O_7$ superconducting film (FIG. 10) and the fluorinated $YBa_2Cu_3O_7$ superconducting film grown on sapphire (FIG. 9) clearly show this result. The conventional non-fluorinated $YBa_2Cu_3O_7$ polycrystalline film includes the columnar growth of discrete crystallites with sharp, well-defined, high angle grain boundaries disposed therebetween. However, no such grain boundaries are present in the fluorinated $YBa_2Cu_3O_7$ epitaxial-like superconducting film.

With reference to FIGS. 12 and 13, the effect of fluorine on the epitaxial-like growth of superconducting films without depending on the lattice structure of an underlying substrate can be seen with respect to films grown on a 1.8 micron silver layer, specifically configured in the (111) orientation, atop a mica base. The surface morphology of the fluorinated epitaxial-like film provides a much smoother, indeed a substantially mirror-like surface in which the absence of substantial cracks provides proof of the strain-relief inherent in the process disclosed herein. FIG. 12 depicts the surface morphology of an unfluorinated YBaCuO film deposited at 680° C.; 50 mT. This film clearly has a highly unaligned polycrystalline, high angle grain boundary nature. FIG. 13 depicts a fluorinated YBaCuO film deposited at 680° C.; 30 mT. While maintaining the operative conditions essentially identical to those associated with the film in FIG. 12, a highly aligned, epitaxial-like, fluorinated superconducting film is grown regardless of the lattice structure of underlying substrate by adding fluorine to the target. Clearly, on epitaxial-like structure having few, if any, irregularities.

EXAMPLE 2

A second sample of a perovskite superconducting material comprising metal species and oxygen in combined form was prepared in a parametrically modified, fluorinated state by blending specifically selected compounds to form a second precursor mixture. Thereafter, through the use of the aforementioned laser ablation technique, a fluorinated superconducting $Bi_2Sr_2Ca_2Cu_3O_y$ material was epitaxially grown by evaporating the sample. Specifically this second precursor mixture contained the following compounds, which were weighed out on paper in the following proportions as follows:

| Powder | Actual Weight (g) | Source |
| --- | --- | --- |
| $Bi_2O_3$ | 10.2728 | Alpha |
| $SrCO_3$ | 3.2550 | Troy Scientific |
| $SrF_2$ | 2.7699 | Cerac |
| $CaF_2$ | 3.4422 | Cerac |
| CuO | 5.2602 | Metalsport |
| TOTAL | 25.0001 g | |

The mixture was ground and shaken so as to produce an evenly distributed mixture, which was thereafter compacted into the bottom of a crucible. The sample was thereafter heated in air at standard pressure in a preheated 760° C. furnace. At various intervals, the mixture was removed from the furnace, cooled, reground to ensure thorough blending of the mixture compounds, and reinserted into the 760° C. furnace, according to the following time-temperature regime:

| Time | Activity |
| --- | --- |
| 17 hours, 20 minutes | 760° C. furnace removed, cooled, reground |
| 4 hours, 48 minutes | 760° C. furnace removed, cooled, reground |
| 49 hours, 12 minutes | 760° C. furnace removed, cooled, reground |
| Total 71 hours, 20 minutes | |

After the foregoing regime of heating was completed, a 10 g sample of the mixture was pressed into a pellet-like configuration for use in the laser ablation equipment. The sample was inserted into a drill stock die and compressed in stages to form a pellet. The stages of compressing the mixture into a one inch diameter pellet occurred as follows:

| Pressure | Time |
| --- | --- |
| 5 tons | momentarily |
| 10 tons | momentarily |
| 15 tons | momentarily |
| 20 tons | momentarily |

After being compressed according to the above schedule, the pellet was then subjected to a sintering process in a dry air furnace, according to the following schedule:

| Time | Temperature |
| --- | --- |
| 12 hours | Ramped from 200° C. up to 800° C. |
| 20 hours | 800° C. |
| 8 hours | Ramped from 800° C. to 200° C. in situ |

After completion of the sintering process, the pellet was removed, stored in a dessicator and finally employed as the target in the laser ablation process.

The sintered target was positioned in a conventional vacuumized chamber (not illustrated). The target was rotated at about 10 rpm and material was ablated therefrom with pulses from a XeCl excimer laser fired at 2 Hz. The laser energy was maintained at about 350 mJ. During the one hour deposition process, the chamber was maintained at a partial pressure of about 50 mT and the substrate holder was maintained at about 720° C.

The sample superconducting film of the $Bi_2Sr_2Ca_2Cu_3O_y$ material so produced was thereafter tested to determine the effect of the parametric modifier element, fluorine, on superconducting performance. The analysis of the exact stoichiometry of this film has not as yet been completed; however, y is in the range of 5.0 to 9.0.

Referring now to FIG. 14, there is illustrated the x-ray diffraction pattern of the laser ablated $Bi_2Sr_2Ca_2Cu_3O_y$ film from the fluorinated target. Degrees $2\theta$ is plotted on the abscissa and intensity is plotted on the ordinate. It is interesting to note that the superconducting film generated from the multiphasic target, which contains no superconducting phase, is virtually "single phase." The two most intense diffraction peaks of a completely random diffraction such as (103) and (013)/(110) are hardly seen, indicating that the c-axis of the fluorinated superconducting film is predominately normal to the basal plane of the substrate. This fluorinated superconducting film showed improved electrical transport properties. Again, the instant inventors hypothesize, without intending to be bound thereto, that fluorine is playing a major role in organizing film growth in the plasma as well as cleaning the surface of nucleation centers which would otherwise initiate columnar growth.

With reference to FIG. 15, a 360° $\Phi$ x-ray diffraction scan of the laser abalated BiSrCaCuO film deposited on $Al_2O_3$ from a fluorinated target is shown. This 360° scan was taken with the sample $\theta$ and $\chi$ angles and the detector $2\theta$ angle set for the BiSrCaCuO (2 0 10) and (0 2 10) reflections. Using the hexagonal coordinate system for $Al_2O_3$ (a=b=4.758 Å, c=12.991 Å, $\alpha=\beta=90°$, $\gamma=120°$) the $Al_2O_3$ (110) planes lie about 1.3° from parallel to the substrate surface. The BiSrCaCuO film has its c-axis along the substrate surface normal with the mosaic spread of about 2° FWHM. Although the a and b axis are rotated about 7° away from aligning with the (001) or (1-10) planes, this scan clearly reveals an oriented, epitaxial-like superconducting film structure.

FIG. 16 is a graphic comparison of the transition to the superconducting states of the fluorinated $Bi_2Sr_2Ca_2Cu_3O_y$ superconducting film deposited from the multiphased fluorinated target pellet. The superconducting film shows an onset temperature of 112 K. The steep normal state resistivity-temperature slope of the fluorinated superconducting film indicates superior metallic behavior. As mentioned hereinabove with respect to the first example, this steeper slope is known in the art to be the fingerprint of epitaxially grown superconducting films. Accordingly, the instant inventors conclude that the effect of fluorine in promoting the expitaxial growth of superconducting films is unmistakable. It is not limited to a single system or class of material.

With reference to FIGS. 17 and 18, the surface morphology of the fluorinated BiSrCaCuO superconducting film on $Al_2O_3$ is clearly an epitaxial-like structure. These SEM photomicrographs (X10,000 and X40,000) reveal a uniform surface with few irregular occlusions. A highly ordered crystalline pattern exists and virtually no high angle grain boundaries are present. Thus, an epitaxial-like BiSrCaCuO film is formed having a uniform, epitaxial-like, crystalline pattern.

SUMMARY

In summary, a high quality epitaxial-like ceramic defect oxide-type superconducting film can be reproducibility grown on sapphire, silver, stainless steel or any other substrate (regardless of lattice structure) by using a multiphase fluorinated target. This growth process was totally unanticipated or predicted by the work of other scientists in the field. It is believed unquestionable that fluorine plays the dominant role in promoting the "epitaxy". It is suggested herein that the role of fluorine is to control the presence of nucleation centers, whether by etching or otherwise chemically neutralizing those centers, on the deposition surface and to enhance the growth of the superconducting film along the a-b axis. Technologically, this finding is particularly important because high $T_c$ superconducting film can now be grown on any flexible metallic substrate, such as stainless steel and silver (whether planar or curved), which substrates are needed for high field applications. Importantly, the high quality fluorinated superconducting film is grown at relatively low temperature. As a result, the grain boundary weak link effect and the interfacial diffusion between the superconducting film and the substrate are minimized and a high critical current density can be achieved. And all of the foregoing results are substrate independent, i.e., they are achieved without the need for a substrate lattice structure matched to the crystallographic lattice structure of the superconducting material.

With reference again to FIGS. 12 and 13, the effect of fluorine on the epitaxial-like growth of superconducting films without depending on the lattice structure of an underlying substrate can be seen with respect to films grown on a 1.8 micron silver layer, specifically configured in the (111) orientation, atop a mica base. These SEM photomicrographs veal the surface morphology of two different laser deposited superconducting films on identical substrates. FIG. 12 depicts the surface morphology of an unfluorinated YBaCuO film deposited at 680° C.; 50 mT. This film clearly has a highly unaligned polycrystalline, high angle grain boundary nature. FIG. 13 depicts a fluorinated YBaCuO film deposited at 680° C.; 30 mT. While maintaining the operative conditions essentially identical to those associated with the film in FIG. 12, a highly aligned, epitaxial-like, fluorinated superconducting film is grown regardless of the lattice structure of underlying substrate adding fluorine to the target. Clearly, an epitaxial-like structure having few, if any, irregularities.

It is essential that one final point be made. As the reader can appreciate from a perusal of the "epitaxial-like" growth illustrated in FIG. 9 hereof, the scale employed therein is a relatively small one wherein one (1) inch is equal to about 0.05 microns (500 Angstroms). Therefore, the width of the microphotographs reveals single crystal growth over about seven (7) inches or 3500 Angstroms. However, a laser scan of the surface, during Raman spectroscopy measurements, demonstrated that there was no visible termination of said epitaxial growth. Indeed, the scan showed that a single crystal had been deposited, which crystal extended for over a millimeter in length. The reader should realize that this was the extent to which said laser could be moved. The conclusion to be drawn is that single crystallites of infinite length can be manufactured using the method of the instant invention.

While the instant invention has been described with respect to certain specific examples and preferred embodiments, these examples and preferred embodiments are not intended to limit the scope of the invention, but rather, the instant invention should only be limited by the scope of the claims attached hereto and those equivalents thereof which would be obvious to those of ordinary skill in the art. The disclosed invention is not to be limited to any narrow class of high $T_c$ superconducting materials or to any narrow type of deposition process. The inventors have discovered a process which makes the commercial fabrication of superconducting materials a reality and deserve a broad scope of patent coverage for making this phenomena public.

We therefore claim:

1. A method of fabricating a fluorinated high $T_c$ perovskite superconducting film which is deposited directly upon a substrate material without an interfacial template layer disposed therebetween, said substrate material having a lattice structure which does not match the lattice structure of the superconducting film, said method including the steps of:

providing a substrate in the form of a roll of substrate material, said substrate material characterized by a lattice structure differing from the lattice structure of the fluorinated perovskite superconducting film to be deposited thereupon;

providing at least one non-stoichiometric, fluorinated target;

providing a chamber defining a deposition region therewithin;

evacuating said chamber to sub-atmospheric pressure;

providing a background atmosphere including at least a partial pressure of $O_2$ in said deposition region;

unrolling said roll of substrate material;

heating said substrate material;

providing a laser;

advancing said substrate material through said deposition region;

pulsing said laser so as to laser ablate the fluorinated target material, in said background atmosphere, onto said substrate material as said substrate material advances through said deposition region; and controlling said partial pressure of $O_2$ in said deposition region and the temperature of said substrate material such that the fluorinated material deposited onto said heated substrate material is superconducting without a post deposition oxygen anneal;

whereby a continuous, fluorinated perovskite superconducting film characterized by basal plane alignment of the unit cells thereof and a lattice structure which is different than that of said substrate material is grown directly on said substrate material.

2. The method of claim 1, wherein the step of providing a non-stoichiometric fluorinated target includes providing a sintered, multiphased target including $BaF_2$, $CuO$ and $Y_2O_3$.

3. The method of claim 1, wherein the step of providing a non-stoichiometric, fluorinated target comprises providing a sintered body of $Y_1Ba_{2.7}Cu_{2.63}O_{4.1}F_{5.4}$ target material.

4. The method of claim 1, wherein the step of providing a non-stoichiometric fluorinated target comprises providing a sintered, multiphased target including $Bi_2O_3$, $SrCO_3$, $SrF_2$, and $CuO$.

5. The method of claim 1, wherein the step of providing a non-stoichiometric fluorinated target comprises providing a sintered, multiphased target including a sintered body of $Bi_2Sr_2Ca_2Cu_3O_y$.

6. The method of claim 1, including the further step of maintaining said background atmosphere at a pressure in the range of about 25 to 50 mTorr.

7. The method of claim 1, wherein the step of providing at least one non-stoichiometric fluorinated target includes providing a plurality of non-stoichiometric fluorinated targets; and said method includes a further step of simultaneously laser ablating material from said plurality of targets to uniformly deposit superconducting material onto said substrate material.

8. The method of claim 1, including the further step of forming the roll of substrate material of sapphire.

9. The method of claim 1, wherein silver film is deposited onto one surface of the substrate material.

10. The method of claim 1, including the further step of providing said roll of substrate material in the form of a roll of wire upon which the superconducting material is deposited.

11. The method of claim 10, including the further step of fabricating the wire of silver.

12. The method of claim 10, includin the further step of depositing a silver film onto the wire prior to depositing the superconducting material thereupon.

13. A method of sequentially fabricating a fluorinated high $T_c$ perovskite superconducting film which is deposited directly upon substrates without an interfacial template layer disposed therebetween, said substrates characterized by a lattice structure which does not match the lattice structure of said superconducting film, said method including the steps of:

providing a plurality of substrates characterized by a lattice structure differing from the lattice structure of the fluorinated perovskite superconducting film;

providing at least one non-stoichiometric, fluorinated target;

providing a chamber defining a deposition region therewithin;

evacuating said chamber to sub-atmospheric pressure;

providing a background atmosphere including at least a partial pressure of $O_2$ in said deposition region;

providing means for sequentially advancing discrete ones of said substrates through said deposition region;

heating said plurality of substrates;

providing a laser;

advancing said substrates through said deposition region;

pulsing said laser to laser ablate the fluorinated target material in said background atmosphere onto said substrates sequentially advanced through said deposition region; and controlling said partial pressure of $O_2$ in said deposition region and the temperature of said substrate such that the fluorinated material deposited onto said heated substrates is superconducting without the need for a post deposition oxygen anneal, whereby a fluorinated perovskite superconducting film characterized by basal plane alignment of the unit cells thereof and a lattice structure which is different than that of said substrates is sequentially grown directly on said discrete substrates.

14. The method of claim 13, wherein the step of providing a non-stoichiometric fluorinated target includes providing a sintered, multiphased target including $BaF_2$, $CuO$ and $Y_2O_3$.

15. The method of claim 13, wherein the step of providing a non-stoichiometric, fluorinated target comprises providing a sintered body of $Y_1Ba_{2.7}Cu_{2.63}O_{4.1}F_{5.4}$ target material.

16. The method of claim 13, wherein the step of providing a non-stoichiometric fluorinated target comprises providing a sintered, multiphased target including $Bi_2O_3$, $SrCo_3$, $SrF_2$, and $CuO$.

17. The method of claim 13, wherein the step of providing a non-stoichiometric fluorinated target comprises providing a sintered, multiphased target including a sintered body of $Bi_2Sr_2Ca_2Cu_3O_y$.

18. The method of claim 13, including the further step of maintaining said background atmosphere at a pressure in the range of about 25 to 50 mTorr.

19. The method of claim 13, wherein the step of providing at least one non-stoichiometric fluorinated target includes providing a plurality of non-stoichiometric fluorinated targets; and said method includes a further step of simultaneously laser ablating material from said plurality of targets to uniformly and sequentially deposit superconducting material onto discrete ones of said plurality of substrates being advanced through said deposition region.

20. The method of claim 13, further including the step of introducing said plurality of substrates into said deposition region simultaneously.

21. The method of claim 13, further including the step of disposing said substrates on a cassette.

22. The method of claim 21, further including the step of sequentially selecting a substrate from said cassette and advancing said selected substrate through said deposition region.

23. The method of claim 13, including the further step of fabricating each of said plurality of substrates from sapphire.

24. The method of claim 23, further including the further step of depositing a layer of silver atop one surface of each of said plurality of sapphire substrates.

* * * * *